United States Patent
Hayashi

(10) Patent No.: US 9,239,515 B2
(45) Date of Patent: Jan. 19, 2016

(54) REFLECTIVE MASK BLANK FOR EUV LITHOGRAPHY

(71) Applicant: Asahi Glass Company, Limited, Chiyoda-ku (JP)

(72) Inventor: Kazuyuki Hayashi, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 87 days.

(21) Appl. No.: 14/288,908

(22) Filed: May 28, 2014

(65) Prior Publication Data

US 2014/0356770 A1 Dec. 4, 2014

(30) Foreign Application Priority Data

May 31, 2013 (JP) .................................. 2013-115186
Nov. 20, 2013 (JP) .................................. 2013-239914

(51) Int. Cl.
*G03F 1/24* (2012.01)
*G03F 1/22* (2012.01)

(52) U.S. Cl.
CPC ........................................ *G03F 1/24* (2013.01)

(58) Field of Classification Search
CPC ..................................... G03F 1/22; G03F 1/24
USPC ........................................................... 430/5
See application file for complete search history.

(56) References Cited

U.S. PATENT DOCUMENTS

| | | | |
|---|---|---|---|
| 7,390,596 B2 | 6/2008 | Ishibashi et al. | |
| 7,713,666 B2 | 5/2010 | Hayashi et al. | |

(Continued)

FOREIGN PATENT DOCUMENTS

| | | |
|---|---|---|
| JP | 2004-6798 | 1/2004 |
| JP | 2006-228766 | 8/2006 |

(Continued)

*Primary Examiner* — Stephen Rosasco
(74) *Attorney, Agent, or Firm* — Oblon, McClelland, Maier & Neustadt, L.L.P.

(57) ABSTRACT

To provide an EUV mask blank which has an absorber layer having such a structure that the phase difference between a reflective layer and the absorber layer is in the vicinity of 180°, and the change of the phase difference between the reflective layer and the absorber layer is small to the film thick change of the absorber layer, and of which the absorber layer can be expected to be further thinner than a conventional absorber layer.

A reflective mask blank for EUV lithography, comprising a substrate, and a reflective layer for reflecting EUV light and an absorber layer for absorbing EUV light formed in this order on the substrate, wherein the absorber layer consists of a layer (upper layer) on the surface side and a layer (lower layer) on the substrate side, one of the upper layer and the lower layer of the absorber layer is a Cr film containing chromium (Cr) as the main component and containing at least one of oxygen (O) and nitrogen (N), the other is a TaPd film containing tantalum (Ta) and palladium (Pd) as the main components and containing at least one of oxygen (O) and nitrogen (N), and the absorber layer satisfies the following conditions (1) to (5):

(1) the total film thickness (L) of the absorber layer is at least 30 nm and at most 45 nm;
(2) the film thickness of the TaPd film is at least 8 nm and at most 36 nm;
(3) the peak reflectivity of the surface of the absorber layer to EUV light is at least 5% and at most 12%;
(4) the phase difference ($\phi$) between EUV reflected light on the surface of the reflective layer and EUV reflected light on the surface of the absorber layer, is within a range of 180°±10°; and
(5) the gradient ($\Delta\phi/\Delta L$) of the change ($\Delta\phi$) of the above phase difference ($\phi$) to the change ($\Delta L$) of the total film thickness (L) of the absorber layer is at most 15 deg/nm.

21 Claims, 2 Drawing Sheets

(56) References Cited

U.S. PATENT DOCUMENTS

| | | |
|---|---|---|
| 7,718,324 B2 | 5/2010 | Hayashi et al. |
| 7,855,036 B2 | 12/2010 | Hayashi et al. |
| 7,906,259 B2 | 3/2011 | Hayashi et al. |
| 8,029,950 B2 | 10/2011 | Hayashi et al. |
| 8,088,538 B2 | 1/2012 | Hayashi et al. |
| 8,133,643 B2 | 3/2012 | Hayashi |
| 8,137,872 B2 | 3/2012 | Hayashi |
| 8,168,352 B2 | 5/2012 | Hayashi et al. |
| 8,227,152 B2 | 7/2012 | Hayashi |
| 8,288,062 B2 | 10/2012 | Hayashi et al. |
| 2005/0208389 A1 | 9/2005 | Ishibashi et al. |
| 2006/0251973 A1 | 11/2006 | Takaki et al. |
| 2012/0322000 A1 | 12/2012 | Uno et al. |
| 2013/0164660 A1 | 6/2013 | Hayashi |
| 2013/0196255 A1 | 8/2013 | Hayashi |
| 2013/0316272 A1 | 11/2013 | Hayashi et al. |
| 2013/0323630 A1 | 12/2013 | Maeshige et al. |
| 2014/0186752 A1 | 7/2014 | Kinoshita et al. |

FOREIGN PATENT DOCUMENTS

| | | |
|---|---|---|
| WO | WO 2011/004850 A1 | 1/2011 |
| WO | WO 2012/026463 A1 | 3/2012 |

REFLECTIVE MASK BLANK FOR EUV LITHOGRAPHY

TECHNICAL FIELD

The present invention relates to a reflective mask blank for EUV (Extreme Ultraviolet) lithography (hereinafter, in this specification, referred to simply as "EUV mask blank") to be used for the production of semiconductors, etc., and a reflective mask for EUV lithography (hereinafter, in this specification, referred to simply as "EUV mask") obtained by patterning an absorber layer of the EUV mask blank.

BACKGROUND ART

Heretofore, in the semiconductor industry, a photolithography method employing visible light or ultraviolet light has been used as a technique to transfer a fine pattern required to form an integrated circuit with a fine pattern on e.g. a Si substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (wavelength: 193 nm) is employed, about 45 nm is presumed to be the limit. Under the circumstances, as an exposure technique for the next generation employing an exposure wavelength shorter than 45 nm, EUV lithography is expected to be prospective, which is an exposure technique employing EUV light having a wavelength further shorter than ArF laser (hereinafter referred to as "EUV light"). In this specification, EUV light is meant for a light ray having a wavelength within a soft X-ray region or within a vacuum ultraviolet region, specifically for a light ray having a wavelength of from about 10 to 20 nm, particularly about 13.5 nm±0.3 nm.

EUV light is likely to be absorbed by all kinds of substances, and the refractive index of substances at such a wavelength is close to 1, whereby it is not possible to use a conventional dioptric system like photolithography employing visible light or ultraviolet light. Therefore, in EUV lithography, a catoptric system, i.e. a combination of an EUV mask and a mirror, is employed.

A mask blank is a stacked member before forming a mask pattern on a photomask. In the case of an EUV mask blank, it has a structure wherein a reflective layer to reflect EUV light and an absorber layer to absorb EUV light, are formed in this order on a substrate made of e.g. glass (Patent Document 1). For the absorber layer, a material having a high absorption coefficient to EUV light, specifically e.g. a material containing Ta as the main component, is used.

Patent Document 1 discloses that a nitride of a tantalum boron alloy (TaBN), an oxide of a tantalum boron alloy (TaBO) and an oxynitride of a tantalum boron alloy (TaBNO) are preferred as the material of the absorber layer since they have a high absorption coefficient to EUV light and further have a low reflectivity to deep ultraviolet light in the wavelength region (about from 190 nm to 260 nm) of pattern inspection light.

In recent years, in an EUV mask blank, the absorber layer is required to be thin. In EUV lithography, the exposure light is applied from a direction at an angle of several degrees, usually 6°, to the vertical direction to the EUV mask, not from the vertical direction. On that occasion, if the absorber layer is thick, at the time of EUV lithography, a shadow may be formed by exposure light on a mask pattern formed by removing a part of the absorber layer by etching, and the shadow is likely to impair the shape precision and the dimensional precision of a mask pattern to be transferred to a resist on a substrate such as a Si wafer using the EUV mask (hereinafter referred to as "transfer pattern"). This problem is more remarkable as the line width of a mask pattern formed on an EUV mask is thinner, and accordingly it is required to make the absorber layer of an EUV mask blank thinner.

As mentioned above, for an absorber layer of an EUV mask blank, a material having a high absorption coefficient to EUV light is used, and its film thickness is ideally such a thickness that when EUV light is applied to the surface of the absorber layer, all the applied EUV light is absorbed in the absorber layer. However, as mentioned above, since the absorber layer is required to be thin, not all the applied EUV light can be absorbed in the absorber layer, and a part thereof becomes reflected light.

What is required when a transfer pattern is formed on a resist of a substrate by EUV lithography using an EUV mask is the contrast of reflected light in the EUV wavelength region (hereinafter referred to as "EUV reflected light"), that is, the contrast between EUV reflected light from a portion where the absorber layer is removed at the time of mask pattern formation and the reflective layer is exposed, and EUV reflected light from a portion where the absorber layer is not removed at the time of mask pattern formation. Accordingly, it has been considered that so long as the contrast of EUV reflected light is sufficiently secured, there is no problem even if not all the applied EUV light is absorbed in the absorber layer.

Based on the above concept, in order to make the absorber layer thinner, an EUV mask utilizing the principle of phase shift has been proposed (Patent Document 2). This is characterized in that the reflectivity to EUV reflected light from a portion where the absorber layer was not removed at the time of mask pattern formation is from 3 to 15%, and the phase difference with EUV reflected light from a portion where the absorber layer was removed at the time of mask pattern formation and the reflective layer is exposed is from 175 to 185°. It is disclosed that such an EUV mask can maintain a sufficient contrast with the reflective layer to EUV reflected light from the absorber layer utilizing the principle of phase shift, and accordingly the absorber layer can be made thin.

PRIOR ART DOCUMENTS

Patent Documents

Patent Document 1: JP-A-2004-6798
Patent Document 2: JP-A-2006-228766

DISCLOSURE OF INVENTION

Technical Problem

However, in the case of an absorber layer containing Ta as the main component as disclosed in Patent Document 1, the minimum film thickness of the absorber layer is limited to from 50 to 60 nm. The limit of the film thickness when the absorber layer is to be made thin greatly depends on the refractive index n and the extinction coefficient k of the metal as the main component.

In general, the phase difference between the reflective layer and the absorber layer is represented by the following formula.

$$\phi = 4\pi(1-n) \times d \times \cos\theta / \lambda$$

wherein φ: the phase difference, n: the refractive index of the absorber layer, d: the film thickness of the absorber layer, θ: the incident angle of EUV light, and λ: the wavelength of EUV light.

The reflection contrast is maximum when the above phase difference φ is 180° (=π). The film thickness with such a phase difference is represented by the following formula.

$$d=\lambda/\{4(1-n)\times\cos\theta\}$$

That is, a lower refractive index n of the absorber layer is advantageous to make the absorber layer thin. For example, in the case of an absorber layer containing Ta as the main component, since its refractive index is n=0.945, when the refractive index of the absorber layer is less than 0.945, the absorber layer can be made further thinner. Further, the extinction coefficient k is preferably k=0.020 to 0.080, so as to obtain a reflectivity of from 2 to 30%.

Accordingly, the absorber layer preferably has a refractive index of less than 0.945 and an extinction coefficient k of from 0.020 to 0.080, with a view to making it thin.

Patent Document 2 discloses a range of the optimum optical constant of a halftone film (corresponding to the absorber layer), and discloses optical properties to a single layer structure of titanium (Ti) or tungsten (W) as an example. However, in the case of the halftone film disclosed in Patent Document 2, the optimum thickness with which the phase difference between the reflective layer and the halftone film is from 175° to 185° is necessarily determined to a specific film thickness by the optical constant of the halftone film to the EUV wavelength. Accordingly, as shown in FIG. 3, in a case where the optimum film thickness of the halftone film is in a film thickness range where the phase difference change relative to the film thickness change is significant, it is required to strictly control the film thickness of the halftone film, and such is unfavorable in view of productivity.

Under these circumstances, it is an object of the present invention to provide an EUV mask blank which has an absorber layer having such a structure that the phase difference between the reflective layer and the absorber layer is in the vicinity of 180°, and the change of the phase difference between the reflective layer and the absorber layer is small to the film thickness change of the absorber layer, and of which the absorber layer can be expected to be further thinner than a conventional absorber layer.

Solution to Problem

The present inventor has conducted extensive studies to achieve the above object and as a result, found that the phase difference between the reflective layer and the absorber layer is in the vicinity of 180°, the change of the phase difference between the reflective layer and the absorber layer is small to the film thickness change of the absorber layer, and the absorber layer can be made further thinner than a conventional absorber layer, by the absorber layer consisting of a layer (upper layer) on the surface side and a layer (lower layer) on the substrate side, one of the upper layer and the lower layer being a Cr film containing chromium (Cr) as the main component and containing at least one of oxygen (O) and nitrogen (N), and the other being a TaPd film containing tantalum (Ta) and palladium (Pd) as the main components, and containing at least one of O and N.

The present invention has been accomplished based on the above discovery, and provides a reflective mask blank for EUV lithography (hereinafter referred to as "an EUV mask blank of the present invention"), comprising a substrate, and a reflective layer for reflecting EUV light and an absorber layer for absorbing EUV light formed in this order on the substrate, wherein the absorber layer consists of a layer (upper layer) on the surface side and a layer (lower layer) on the substrate side, one of the upper layer and the lower layer of the absorber layer is a Cr film containing chromium (Cr) as the main component and containing at least one of oxygen (O) and nitrogen (N), the other is a TaPd film containing tantalum (Ta) and palladium (Pd) as the main components and containing at least one of oxygen (O) and nitrogen (N), and the absorber layer satisfies the following conditions (1) to (5):

(1) the total film thickness (L) of the absorber layer is at least 30 nm and at most 45 nm;

(2) the film thickness of the TaPd film is at least 8 nm and at most 36 nm;

(3) the peak reflectivity of the surface of the absorber layer to EUV light is at least 5% and at most 12%;

(4) the phase difference (φ) between EUV reflected light on the surface of the reflective layer and EUV reflected light on the surface of the absorber layer, is within a range of 180°±10°; and (5) the gradient (Δφ/ΔL) of the change (Δφ) of the above phase difference (φ) to the change (ΔL) of the total film thickness (L) of the absorber layer is at most 15 deg/nm.

In the EUV mask blank of the present invention, it is preferred that the Cr film is a CrN film containing Cr and N, and having a Cr content of from 40 to 97 at %, a N content of from 3 to 60 at % and a total content of Cr and N of from 95 to 100 at %.

In the EUV mask blank of the present invention, it is preferred that the TaPd film is a TaPdN film containing Ta, Pd and N, and having a Ta content of from 10 to 60 at %, a Pd content of from 20 to 70 at %, a N content of from 10 to 70 at %, and a total content of Ta, Pd and N of from 95 to 100 at %.

In the EUV mask blank of the present invention, at least one of the Cr film and the TaPd film may further contain hydrogen (H), silicon (Si) and boron (B) in a total content of from 0.1 to 10 at %.

In the EUV mask blank of the present invention, the upper layer may have a two-layer structure of the CrN film and a surface protective layer formed on the CrN film, and the surface protective layer is a CrO film containing Cr and O and having a Cr content of from 15 to 70 at % and an O content of from 30 to 85 at %, or a CrON film containing Cr, O and N and having a Cr content of from 10 to 60 at %, a total content of O and N of from 40 to 90 at % and a compositional ratio of O to N of O:N=9:1 to 6:4.

In the EUV mask blank of the present invention, the upper layer may have a two-layer structure of the TaPdN film and a surface protective layer formed on the TaPdN film, and the surface protective layer is a TaPdO film containing Ta, Pd and O and having an O content of from 30 to 85 at % or a TaPdON film containing Ta, Pd, O and N and having a total content of O and N of from 40 to 90 at % and a compositional ratio of O to N of O:N=9:1 to 6:4.

The TaPdO film preferably has a Ta content of from 7 to 32 at %, a Pd content of from 8 to 38 at % and an O content of from 30 to 85 at %.

The TaPdON film preferably has a Ta content of from 5 to 27 at %, a Pd content of from 5 to 33 at %, a total content of O and N of from 40 to 90 at %, and a compositional ratio of O to N of O:N=9:1 to 6:4.

In the EUV mask blank of the present invention, the film thickness of the surface protective layer is preferably at least 0.5 nm and at most 5 nm.

In the EUV mask blank of the present invention, the surface protective layer may further contain hydrogen (H), silicon (Si) and boron (B) in a total content of from 0.1 to 10 at %.

In the EUV mask blank of the present invention, it is preferred that the crystal state of the absorber layer is amorphous.

In the EUV mask blank of the present invention, it is preferred that the surface roughness (rms) of the surface of the absorber layer is at most 0.5 nm.

In the EUV mask blank of the present invention, it is preferred that a protective layer to protect the reflective layer at the time of forming a pattern on the absorber layer is formed between the reflective layer and the absorber layer, and the protective layer contains Ru or a Ru compound as a constituting material.

In the EUV mask blank of the present invention, in a case where a protective layer containing Ru or a Ru compound as a constituting material is formed, it is preferred that the upper layer is the TaPd film, and the lower layer is the Cr film.

In the EUV mask blank of the present invention, it is preferred that the Cr film is a CrN film, and the CrN film is formed by carrying out a sputtering method using a target containing chromium (Cr) in an inert gas atmosphere containing nitrogen ($N_2$) and at least one of helium (He), argon (Ar), neon (Ne), krypton (Kr) and xenon (Xe).

In the EUV mask blank of the present invention, it is preferred that the TaPd film is the TaPdN film, and the TaPdN film is formed by carrying out a sputtering method using a target containing tantalum (Ta) and palladium (Pd) in an inert gas atmosphere containing nitrogen ($N_2$) and at least one of helium (He), argon (Ar), neon (Ne), krypton (Kr) and xenon (Xe).

In the EUV mask blank of the present invention, it is preferred that the surface protective layer is the TaPdO film, and the TaPdO film is formed by carrying out a sputtering method using a target containing tantalum (Ta) and palladium (Pd) in an inert gas atmosphere containing oxygen ($O_2$) and at least one of helium (He), argon (Ar), neon (Ne), krypton (Kr) and xenon (Xe).

In the EUV mask blank of the present invention, it is preferred that the surface protective layer is the TaPdON film, and the TaPdON film is formed by carrying out a sputtering method using a target containing tantalum (Ta) and palladium (Pd) in an inert gas atmosphere containing oxygen ($O_2$) and nitrogen ($N_2$) and at least one of helium (He), argon (Ar), neon (Ne), krypton (Kr) and xenon (Xe).

In the EUV mask blank of the present invention, it is preferred that the surface protective layer is the CrO film, and the CrO film is formed by carrying out a sputtering method using a target containing chromium (Cr) in an inert gas atmosphere containing oxygen ($O_2$) and at least one of helium (He), argon (Ar), neon (Ne), krypton (Kr) and xenon (Xe).

In the EUV mask blank of the present invention, it is preferred that the surface protective layer is the CrON film, and the CrON film is formed by carrying out a sputtering method using a target containing chromium (Cr) in an inert gas atmosphere containing oxygen ($O_2$) and nitrogen ($N_2$) and at least one of helium (He), argon (Ar), neon (Ne), krypton (Kr) and xenon (Xe).

The present invention further provides a reflective mask for EUV lithography produced by patterning the absorber layer of the EUV mask blank of the present invention.

Advantageous Effects of Invention

In the EUV mask blank of the present invention, by the absorber layer having a lower refractive index to EUV light and having a desired extinction coefficient, the absorber layer can be made thinner than a conventional absorber layer containing Ta as the main component. Accordingly, improvement of the shape precision and the dimensional precision of a transfer pattern transferred on a resist on a substrate such as a Si wafer can be expected.

Further, since the phase difference change to the film thickness change is small in the vicinity of the film thickness with which the phase difference φ between the reflective layer and the absorber layer is 180°±10°, the range of the acceptable film thickness in the process for forming the absorber layer can be broadened.

DESCRIPTION OF EMBODIMENTS

Now, an EUV mask blank of the present invention will be described with reference to the drawings.

Figure 1:
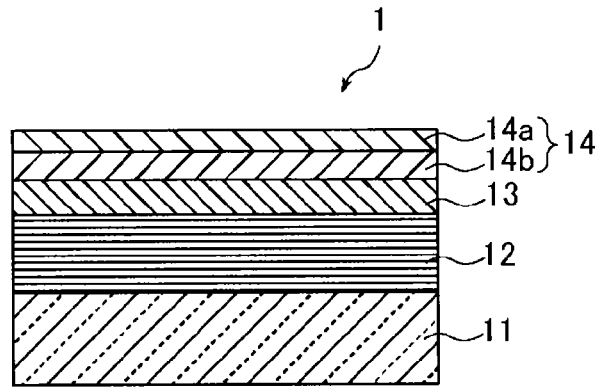
FIG. 1 is a schematic cross-sectional view illustrating an embodiment of the EUV mask blank of the present invention.

FIG. 1 is a schematic cross-sectional view illustrating an embodiment of an EUV mask blank of the present invention. A mask blank 1 shown in FIG. 1 has a reflective layer 12 for reflecting EUV light and an absorber layer 14 for absorbing EUV light formed in this order on a substrate 11. Between the reflective layer 12 and the absorber layer 14, a protective layer 13 is formed for protecting the reflective layer 12 during formation of a pattern on the absorber layer 14. In the EUV mask blank 1 of the present invention, the absorber layer 14 consists of an upper layer 14a and a lower layer 14b. However, in the EUV mask blank 1 of the present invention, in the construction as shown in FIG. 1, only the substrate 11, the reflective layer 12 and the absorber layer 14 (upper layer 14a and lower layer 14b) are essential, and the protective layer 13 is an optional constituting element.

Now, the individual constituting elements of the mask blank 1 will be described.

The substrate 11 is required to satisfy the properties as a substrate for an EUV mask blank.

Therefore, the substrate 11 is preferably one having a low thermal expansion coefficient (specifically, a thermal expansion coefficient at 20° C. of preferably 0±1.0×10$^{-7}$/° C., more preferably 0±0.3×10$^{-7}$/° C., further preferably 0±0.2×10$^{-7}$/° C., still further preferably 0±0.1×10$^{-7}$/° C., particularly preferably 0±0.05×10$^{-7}$/° C.) and being excellent in smoothness, flatness and durability against a cleaning liquid to be used for e.g. cleaning a mask blank or a photomask after pattern formation. As the substrate 11, specifically, glass having a low thermal expansion coefficient, such as $SiO_2$—$TiO_2$ type glass, may be used. However, the substrate is not limited thereto, and it is possible to employ a substrate of e.g. crystallized glass having β-quartz solid solution precipitated, quartz glass, silicon, or a metal. Further, a film such as a stress correcting film may be formed on the substrate 11.

The substrate 11 preferably has a smooth surface having a surface roughness (rms) of at most 0.15 nm and a flatness of at most 100 nm, whereby a high reflectivity to EUV light and high transfer precision of a photomask after forming a pattern can be attained. In this specification, the surface roughness is meant to the root-mean-square roughness Rq (old RMS) in accordance with JIS B0601.

The size, thickness, etc. of the substrate 11 may suitably be determined depending upon e.g. the designed values for the mask. In Examples given hereinafter, a $SiO_2$—$TiO_2$ type glass having a size of 6 inches (152 mm) square and a thickness of 0.25 inch (6.3 mm) was used.

It is preferred that no defect is present on the surface of the substrate 11 which is the side where the reflective layer 12 is to be formed. However, even in a case where a defect is present, in order not to cause a phase defect due to a concave defect and/or a convex defect, it is preferred that the depth of a concave defect or the height of a convex defect is not more than 2 nm, and the half value width of such a concave defect or convex defect is not more than 60 nm.

The reflective layer 12 is required, as the reflective layer of an EUV mask blank, to have a high EUV light reflectivity. Specifically, when EUV light is applied at an incident angle of 6° to the surface of the reflective layer 12, the maximum reflectivity of light in the vicinity of a wavelength of 13.5 nm is preferably at least 60%, more preferably at least 63%, further preferably at least 65%. Further, even in a case where the protective layer 13 is formed on the reflective layer 12, the peak reflectivity of light in the vicinity of a wavelength of 13.5 nm is preferably at least 60%, more preferably at least 63%, further preferably at least 65%.

As the reflective layer 12, usually a multilayer reflective film having a high refractive index layer having a high refractive index to EUV light and a low refractive index layer having a low refractive index to EUV light alternately stacked plural times is used, since a high reflectivity to EUV light can thereby be accomplished. In the multilayer reflective film constituting the reflective layer 12, Si is widely used for the high refractive index layer, and Mo is widely used for the low refractive index layer. That is, a Mo/Si multilayer reflective film is most commonly employed. However, the multilayer reflective film is not limited thereto, and a Ru/Si multilayer reflective film, a Mo/Be multilayer reflective film, a Mo compound/Si compound multilayer reflective film, a Si/Mo/Ru multilayer reflective film, a Si/Mo/Ru/Mo/multilayer reflective film or a Si/Ru/Mo/Ru multilayer reflective film may also be used.

The film thickness of each layer and the number of repeating units of layers constituting the multilayer reflective film as the reflective layer 12 are properly selected depending upon the film material used and the reflectivity to EUV light required for the reflective layer. In the case of a Mo/Si reflective film as an example, in order to obtain a reflective layer 12 having a maximum reflectivity to EUV light of at least 60%, Mo films each having a film thickness of 2.3±0.1 nm and Si films each having a film thickness of 4.5±0.1 nm are stacked so that the number of repeating units becomes from 30 to 60 to obtain a multilayer reflective film.

Further, each layer constituting the multilayer reflective film as the reflective layer 12 may be formed to have a desired thickness by means of a well-known film-forming method such as a magnetron sputtering method or an ion beam sputtering method. For example, in the case of forming a Mo/Si multilayer reflective film by means of an ion beam sputtering method, it is preferred that a Si film is formed to have a thickness of 4.5 nm at an ion accelerating voltage of from 300 to 1,500 V at a film forming rate of from 0.03 to 0.30 nm/sec by using a Si target as the target and an Ar gas (gas pressure: $1.3 \times 10^{-2}$ Pa to $2.7 \times 10^{-2}$ Pa) as the sputtering gas, and then a Mo film is formed to have a thickness of 2.3 nm at an ion accelerating voltage of form 300 to 1,500 V at a film forming rate of from 0.03 to 0.30 nm/sec by using a Mo target as the target and an Ar gas (gas pressure: $1.3 \times 10^{-2}$ Pa to $2.7 \times 10^{-2}$ Pa) as the sputtering gas. When this operation is taken as one cycle, the Mo/Si multilayer reflective film is formed by stacking the Mo films and the Si films by from 30 to 60 cycles.

Further, in order to prevent the surface of the reflective layer 12 from being oxidized, the uppermost layer of the multilayer reflective film as the reflective layer 12 is preferably a layer made of a material which is hardly oxidized. The layer made of a material which is hardly oxidized functions as a cap layer of the reflective layer 12. The layer made of a material which is hardly oxidized, which functions as a cap layer, may, for example, be specifically a Si layer. In a case where the multilayer reflective film as the reflective layer 12 is a Mo/Si multilayer reflective film, by forming the Si layer as the uppermost layer, such an uppermost layer can function as a cap layer. In such a case, the film thickness of the cap layer is preferably 11±2 nm.

The protective layer 13 is formed for the purpose of protecting the reflective layer 12 at the time of forming a pattern in an absorber layer 14 by an etching process, usually a dry etching process, so that the reflective layer 12 will not be damaged by the etching process. Accordingly, as the material for the protective layer 13, a material hardly susceptible to an influence by the etching process of the absorber layer 14 i.e. having an etching rate lower than the absorber layer 14 and hardly susceptible to damage by such an etching process, is selected. The protective layer 13 of the present invention contains Ru or a Ru compound (such as RuB, RuSi or RuNb) as a constituting material.

Further, it is preferred that the protective layer 13 contains no Ta nor Cr, with a view to preventing a decrease in the reflectivity of the surface of the protective layer 13 to EUV light. The Ta and Cr contents in the protective layer 13 are each preferably at most 5 at %, particularly preferably at most 3 at %, and it is further preferred that Ta and Cr are not contained.

The thickness of the protective layer 13 is preferably form 1 to 60 nm, particularly preferably from 1 to 10 nm.

The protective layer 13 is formed by a well-known film-forming method such as a magnetron sputtering method or an ion beam sputtering method. In the case of forming a Ru film by means of a magnetron sputtering method, it is preferably formed to have a thickness of from 2 to 5 nm at a voltage applied of from 30 V to 1,500 V at a film forming rate of from 0.02 to 1.0 nm/sec by using a Ru target as the target and an Ar gas (gas pressure: $1.0 \times 10^{-2}$ Pa to $10 \times 10^{-1}$ Pa) as the sputtering gas.

The property particularly required for the absorber layer 14 is a high contrast between EUV light reflected on the reflective layer 12 and EUV light reflected on the absorber layer 14. In the case of an EUV mask which maintains the contrast with the reflective layer 12 by utilizing the principle of phase shift, not by absorbing EUV light only by the absorber layer 14, as mentioned above, the absorber layer is required to have desired values of the refractive index n and the extinction coefficient k, and n is preferably less than 0.945, more preferably less than 0.930, further preferably less than 0.920. k is preferably from 0.020 to 0.080, more preferably from 0.025 to 0.078, further preferably from 0.030 to 0.075.

Further, in order to utilize the principle of phase shift, the peak reflectivity of the surface of the absorber layer 14 to EUV light, specifically, the maximum reflectivity (peak reflectivity) to light in the vicinity of a wavelength of 13.5 nm when EUV light is applied at an incident angle of 6° to the surface of the absorber layer 14, is preferably at least 5% and at most 12%.

By the above characteristics are achieved by the absorber layer 14 of the EUV mask blank 1 of the present invention consisting of a layer (upper layer 14a) on the surface side and a layer (lower layer 14b) on the substrate 11 side, one of the upper layer 14a and the lower layer 14b being a Cr film containing chromium (Cr) as the main component and containing at least one of oxygen (O) and nitrogen (N), the other being a TaPd film containing tantalum (Ta) and palladium (Pd) as the main components and containing at least one of O and N, and the absorber layer satisfying the following conditions (1) to (5):

(1) the total film thickness (L) of the absorber layer 14 is at least 30 nm and at most 45 nm;

(2) the film thickness of the TaPd film is at least 8 nm and at most 36 nm;

(3) the peak reflectivity of the surface of the absorber layer to EUV light is at least 5% and at most 12%;

(4) the phase difference ($\phi$) between EUV reflected light on the surface of the reflective layer 12 and EUV reflected light on the surface of the absorber layer 14, is within a range of 180°±10°; and (5) the gradient ($\Delta\phi/\Delta L$) of the change ($\Delta\phi$) of the above phase difference ($\phi$) to the change ($\Delta L$) of the total film thickness (L) of the absorber layer 14 is at most 15 deg/nm.

The Cr film may, for example, be a CrO film containing Cr and O, a CrN film containing Cr and N, or a CrON film containing Cr, O and N. Among the above Cr films, a CrN film is preferred, with which a low refractive index to EUV light is obtained, and which is advantageous to make the absorber layer thin.

The Cr content in the CrN film is preferably from 40 to 97 at %, whereby a low refractive index to EUV light is thereby obtained, and such is advantageous to make the absorber layer thin. It is more preferably from 45 to 97 at %, further preferably from 45 to 95 at %.

Further, the N content in the CrN film is preferably from 3 to 60 at %, whereby the film stress can be made small, and is more preferably from 3 to 55 at %, further preferably from 5 to 55 at %. If the Cr content is less than 40 at % (that is, the N content exceeds 60 at %), no desired optical properties will be obtained. Further, if the Cr content exceeds 97 at % (that is, the N content is less than 3 at %), the film stress tends to be large.

Further, the total content of Cr and N in the CrN film is preferably from 95 to 100 at %, more preferably from 97 to 100 at %, further preferably from 99 to 100 at %.

The Cr film in the present invention may further contain hydrogen (H), silicon (Si) and boron (B). In a case where the Cr film contains H, Si and B, their total content is preferably from 0.1 to 10 at %, particularly preferably from 0.1 to 5 at %, whereby the film crystal structure can be made amorphous, and such will contribute to making the surface of the absorber layer smooth.

The above TaPd film may, for example, be a TaPdO film containing Ta, Pd and O, a TaPdN film containing Ta, Pd and N, or a TaPdON film containing Ta, Pd, O and N.

Among the above TaPd films, a TaPdN film is preferred, with which a low refractive index to EUV light can be obtained, and which is advantageous to make the absorber layer thin.

The Ta content in the TaPdN is preferably from 10 to 60 at %, whereby a low refractive index to EUV light is obtained, and such is advantageous to make the absorber layer thin. It is more preferably from 10 to 55 at %, further preferably from 10 to 50 at %.

Further, the Pd content in the TaPdN film is preferably from 20 to 70 at %, whereby a low refractive index to EUV light will be obtained, and such is advantageous to make the absorber layer thin. It is more preferably from 20 to 65 at %, further preferably from 25 to 65 at %.

Further, the N content in the TaPdN film is preferably from 10 to 70 at %, whereby a low refractive index to EUV light will be obtained, and such is advantageous to make the absorber layer thin, and the film stress can be made small. It is more preferably from 10 to 60 at %, further preferably from 10 to 50 at %. If the Ta content exceeds 60 at % or the Pd content is less than 20 at %, no desired optical properties may be obtained. Further, if the Ta content is less than 10 at % or the Pd content exceeds 70 at %, the etching rate may be low. Further, if the N content exceeds 70 at %, no desired optical properties may be obtained, and if the N content is less than 10 at %, the film stress tends to be large.

Further, the total content of Ta, Pd and N in the TaPdN film is preferably from 95 to 100 at %, more preferably from 97 to 100 at %, further preferably from 99 to 100 at %.

The TaPd film in the present invention may further contain hydrogen (H), silicon (Si) and boron (B). In a case where the TaPd film contains H, Si and B, their total content is preferably from 0.1 to 10 at %, particularly preferably from 0.1 to 5 at %, whereby the film crystal structure can be made amorphous, and such will contribute to making the surface of the absorber layer smooth.

With respect to the absorber layer 14, reasons for the above conditions (1) to (5) will be described below.

Regarding Condition (1)

If the total film thickness (L) of the absorber layer 14 is less than 30 nm, the phase difference ($\phi$) between EUV reflected light on the surface of the reflective layer 12 and EUV reflected light on the surface of the absorber layer 14 will not be within a range of 180°±10°.

On the other hand, if the total thickness (L) of the absorber layer 14 exceeds 45 nm, the peak reflectivity of the surface of the absorber layer 14 to EUV light will be less than 5%. Otherwise, the phase difference ($\phi$) between EUV reflected light on the surface of the reflective layer 12 and EUV reflected light on the surface of the absorber layer 14 will not be within a range of 180°±10°.

The total film thickness (L) of the absorber layer 14 is preferably at least 30 nm and at most 43 nm, more preferably at least 30 nm and at most 40 nm.

Regarding Condition (2)

If the thickness of the TaPd layer is less than 8 nm, the peak reflectivity of the surface of the absorber layer 14 to EUV light will be less than 5%. Otherwise, the phase difference ($\phi$) between EUV reflected light on the surface of the reflective layer 12 and EUV reflected light on the surface of the absorber layer 14 will not be within a range of 180°±10°.

On the other hand, if the film thickness of the TaPd film exceeds 36 nm, such problems will arise.

At the time of forming a pattern on the absorber layer 14, a part of the absorber layer 14 is removed by a dry etching process. Since the absorber layer 14 of the present invention is constituted by the upper layer 14a and the lower layer 14b differing in the constituting material, the types of the etching gas to be used for the dry etching process are different. In the case of a Cr film containing Cr as the main component, a chlorine gas ($Cl_2$, $BCl_3$) is preferably used as the etching gas.

On the other hand, in the case of a TaPd film containing Pd as the main component, a fluorine gas ($CF_4$, $CF_3H$) is preferably used as the etching gas. However, in the case of the TaPd film, the etching rate at the time of carrying out the dry etching process is so low as from about ½ to ⅙ as compared with a conventional Ta film (for example, TaN, TaNH or TaBN) containing Ta as the main component and containing no Pd. Thus, if the thickness of the TaPd film exceeds 36 nm, the low etching rate tends to be problematic at the time of carrying out the dry etching process for the purpose of forming a pattern on the absorber layer 14.

Further, the thickness of the TaPd film is preferably at least 8 nm and at most 34 nm, more preferably at least 8 nm and at most 32 nm, further preferably at least 8 nm and at most 30 nm, furthermore preferably at least 8 nm and at most 25 nm, still further preferably at least 8 nm and at most 23 nm, particularly preferably at least 8 nm and at most 20 nm.

Figure 2:
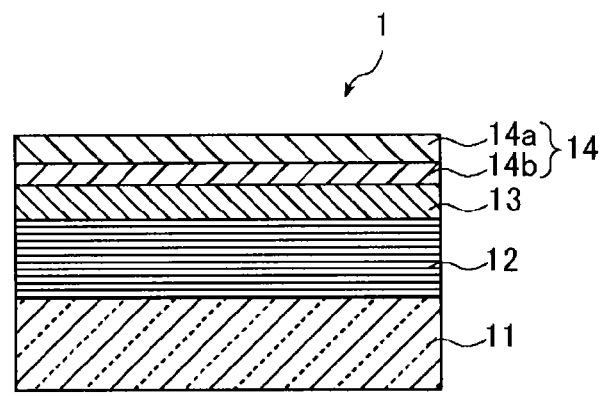
FIG. 2 is a schematic cross-sectional view illustrating another embodiment of the EUV mask blank of the present invention.

The TaPd film may be either of the upper layer 14a and the lower layer 14b constituting the absorber layer 14, and when the upper layer 14a is the TaPd film, the Cr film is the lower layer 14b, and when the lower layer 14b is the TaPd film, the Cr film is the upper layer 14a. In a case where the upper layer 14a of the mask blank 1 shown in FIG. 1 is the TaPd film, a mask blank in which the lower layer 14b is a TaPd film having the same thickness is the mask blank 1 shown in FIG. 2.

However, when the mask blank 1 has a protective layer 13 containing Ru or a Ru compound as a constituting material, a combination of the TaPd film as the upper layer 14a and the Cr film as the lower layer 14b is preferred in some cases from the following reasons. As described above, at the time of carrying out the dry etching process for the Cr film, a chlorine gas is used as the etching gas. The dry etching process using a chlorine gas is less likely to damage the protective layer 13 containing Ru or a Ru compound as the constituting material. Thus, in a case where the lower layer 14b is the Cr film, the damage to the protective layer 13 containing Ru or a Ru compound as the constituting material, immediately below the lower layer 14b, can be reduced.

On the other hand, a combination of the Cr film as the upper layer 14a and the TaPd film as the lower layer 14b is preferred in some cases from the following reasons. As described above, at the time of carrying out the dry etching process for the TaPd film, a fluorine gas is used as the etching gas. The Cr film as the upper layer 14a is highly resistant to the dry etching process by a fluorine gas. Accordingly, at the time of carrying out dry etching of the TaPd film as the lower layer 14b by a fluorine gas, the Cr film as the upper layer 14a functions as a hard mask, and thus a resist applied for forming a pattern can be made thin, and such is advantageous to make the pattern finer.

Regarding Condition (3)

The peak reflectivity of the surface of the absorber layer 14 to EUV light is at least 5% and at most 12%, since such is preferred to utilize the principle of phase shift, as described above.

The peak reflectivity of the surface of the absorber layer 14 to EUV light is preferably at least 5% and at most 11%, more preferably at least 5% and at most 10%.

In a case where the after-mentioned low reflective layer is to be formed on the absorber layer 14, the peak reflectivity of the surface of the low reflective layer to EUV light is preferably within the above range.

Regarding Condition (4)

The phase difference ($\phi$) between EUV reflected light on the surface of the reflective layer 12 and EUV reflected light on the surface of the absorber layer 14 is within a range of $180° \pm 10°$, in order to utilize the principle of phase shift Further, in a case where the protective layer 13 is formed on the reflective layer 12, the phase difference between EUV reflected light on the surface of the protective layer 13 and EUV reflected light on the surface of the absorber layer 14 is regarded as p. The same applies to the condition (5).

Regarding Condition (5)

Figure 3:
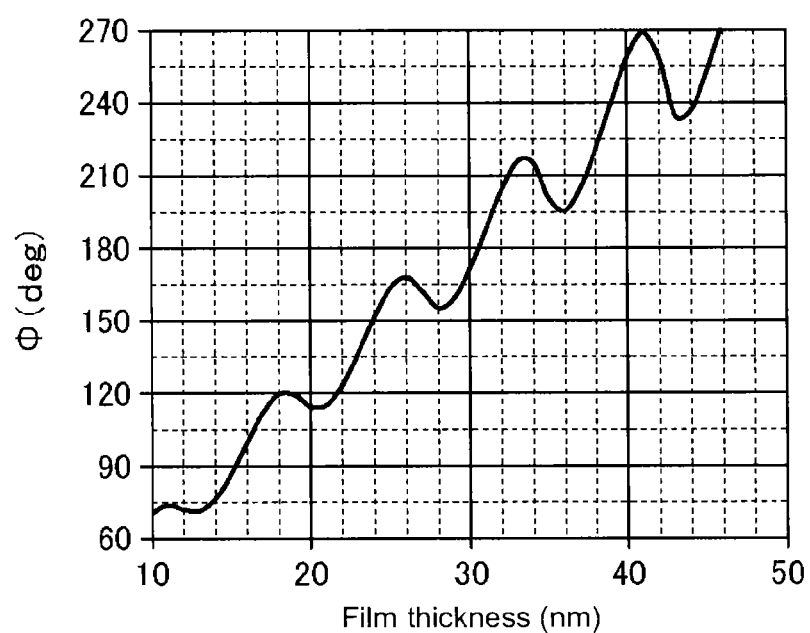
FIG. 3 is a graph obtained by plotting the relation between the film thickness (L) of the absorber layer and the phase difference (φ) to EUV light.

By plotting the relation between the total film thickness (L) of the absorber layer 14 and the phase difference (q) as shown in FIG. 3, a curve like a sine curve is obtained with alternate local maximum values and local minimum values.

The gradient ($\Delta\phi/\Delta L$) of the change ($\Delta\phi$) of the phase difference ($\phi$) to the change ($\Delta L$) of the total film thickness (L) of the absorber layer 14 is at most 15 deg/nm, in order to reduce the phase difference change to the film thickness change under the condition (4), that is, with a film thickness with which p is within a range of $180° \pm 10°$.

When the condition (5) is satisfied, the phase difference to a change of a film thickness±0.7 nm is within a range of $180° \pm 10°$, and in the process for forming the absorber layer 14, the acceptable film thickness range can be broadened. That is, if non-uniformity of the film thickness of the absorber layer may occur, which may be inevitable in the film forming step, fluctuations in the optical properties of EUV light in the plane of the EUV mask blank, and fluctuations (individual difference) in optical properties of EUV light of every EUV mask blank, can be suppressed.

The crystal structure of each of the Cr film and the TaPd film constituting the upper layer 14a and the lower layer 14b of the absorber layer 14 is preferably amorphous due to the above constitution. In this specification, "the crystal state is amorphous" means not only an amorphous structure having no crystal structure at all but also a microcrystal structure.

When the crystal state of each of the Cr film and the TaPd film constituting the upper layer 14a and the lower layer 14b is amorphous, the surface of the absorber layer 14 will be excellent in the smoothness.

In the EUV mask blank 1 of the present invention, the surface roughness (rms) of the surface of the absorber layer 14 obtained by the crystal structures of the Cr film and the TaPd film constituting the upper layer 14a and the lower layer 14b being amorphous, is preferably at most 0.5 nm. Here, the surface roughness of the surface of the absorber layer 14 may be measured by an atomic force microscope. If the surface roughness of the surface of the absorber layer 14 is large, the edge roughness of a pattern to be formed on the absorber layer 14 tends to be large, and the dimensional precision of the pattern tends to be poor. As the pattern becomes fine, the influence of the edge roughness becomes distinct, and therefore, it is required that the surface of the absorber layer 14 is smooth.

When the surface roughness (rms) of the surface of the absorber layer 14 is at most 0.5 nm, the surface of the absorber layer 14 is sufficiently smooth, thus the dimensional precision of a pattern will not be deteriorated due to an influence of the edge roughness. The surface roughness (rms) of the surface of the absorber layer 14 is more preferably at most 0.4 nm, further preferably at most 0.3 nm.

Whether the crystal states of the Cr film and the TaPd film constituting the upper layer 14a and the lower layer 14b are amorphous, i.e. an amorphous structure or in a microcrystal structure, may be confirmed by an X-ray diffraction (XRD) method. When the crystal state of the Cr film and the TaPd film constituting the upper layer 14a and the lower layer 14b are an amorphous structure or a microcrystal structure, no sharp peak will be observed among the diffraction peaks obtained by the XRD measurement.

The total film stress of the Cr film and the TaPd film constituting the upper layer 14a and the lower layer 14b is preferably within a range of ±200 MPa, particularly preferably within ±180 MPa, whereby the shape precision and the dimensional precision of a mask transfer pattern transferred on a resist on a substrate such as a Si wafer will not be deteriorated.

The Cr film and the TaPd film constituting the upper layer 14a and the lower 14b may be formed by a well-known film-forming method, such as a sputtering method.

In a case where the Cr film is a CrN film, it may be formed by a sputtering method such as a magnetron sputtering method or an ion beam sputtering method using a Cr target in an inert gas atmosphere containing nitrogen ($N_2$) and at least one of helium (He), argon (Ar), neon (Ne), krypton (Kr) and xenon (Xe). Conditions for forming a CrN film will be described below with reference to a case where the inert gas atmosphere is an atmosphere containing Ar and $N_2$, as an example.

Conditions for Forming CrN Film
Sputtering gas: A mixed gas of Ar and $N_2$ (Ar gas concentration: 30 to 70 vol %, $N_2$ gas concentration: 30 to 70 vol %, gas pressure: $0.5 \times 10^{-1}$ Pa to 1.0 Pa)
Input power: 300 to 2,000 W
Film forming rate: 0.0083 to 1 nm/sec The above is described with reference to a case where the sputtering gas is a mixed gas of Ar and $N_2$, and in a case where a mixed gas of an inert gas other than Ar and $N_2$ or a mixed gas of a plurality of inert gases and $N_2$ is used as the sputtering gas, the total concentration of such inert gases is within the same concentration range as the above Ar gas concentration.

In a case where the TaPd film is a TaPdN film, it may be formed by a sputtering method such as a magnetron sputtering method or an ion beam sputtering method using a target containing Ta and Pd in an inert gas atmosphere containing nitrogen ($N_2$) and at least one of helium (He), argon (Ar), neon (Ne), Krypton (Kr) and xenon (Xe).

Here, use of target containing Ta and Pd includes both use of two metal targets i.e. a Ta target and a Pd target and use of a compound target containing Ta and Pd.

Use of two metal targets is advantageous to adjust the constituting components of TaPdN. When two metal targets are used, the constituting components of the TaPdN film can be adjusted by adjusting the input power to the targets. On the other hand, in a case where a compound target is used, the target composition is preferably preliminarily adjusted so that the TaPdN film to be formed will have a desired composition.

Conditions for forming the TaPdN film will be described below with reference to a case where the inert gas atmosphere contains Ar and $N_2$.

Conditions for Forming the TaPdN Film
Sputtering gas: A mixed gas of Ar and $N_2$ (Ar gas concentration: 97 to 20 vol %, $N_2$ gas concentration: 3 to 80 vol %, gas pressure: $0.5 \times 10^{-1}$ Pa to 1.0 Pa)
Input power: 300 to 1,000 W, preferably 50 to 750 W, more preferably 70 to 500 W
Film forming rate: 0.0083 to 1 nm/sec, preferably 0.017 to 0.75 nm/sec, more preferably 0.025 to 0.5 nm/sec The above is described with reference to a case where the sputtering gas is a mixed gas of Ar and $N_2$. In a case where a mixed gas of an inert gas other than Ar and $N_2$ or a mixed gas of a plurality of inert gases and $N_2$ is used as the sputtering gas, the total concentration of such inert gases is within the same concentration range as the Ar gas concentration.

The EUV mask blank 1 of the present invention may have a low reflective layer to inspection light to be used for inspection of a mask pattern formed on the absorber layer 14, in addition to the structure as shown in FIG. 1, i.e. the substrate 11, the reflective layer 12, the protective layer 13 and the absorber layer 14 (upper layer 14a and lower layer 14b).

The low reflective layer is constituted by a film having a low reflectivity to inspection light to be used for inspection of a mask pattern. In the preparation of an EUV mask, after forming a pattern in the absorber layer, inspection is carried out to see that this pattern is formed as designed. In this inspection of the mask pattern, an inspection machine using light of usually about 257 nm as inspection light, is employed. That is, the inspection is made by the difference in reflectivity to such light of about 257 nm, specifically by the difference in the reflectivity between a surface exposed by removal of the absorber layer by patterning and the surface of the absorber layer remained without being removed by the patterning. Here, the former is the surface of the reflective layer or the surface of the protective layer, and is usually the surface of the protective layer. Accordingly, if the difference in the reflectivity between the reflective layer surface or the protective layer surface and the absorber layer surface to the wavelength of inspection light, is small, the contrast at the time of the inspection tends to be poor, and an accurate inspection may not be possible.

The absorber layer consisting of the Cr film and the TaPd film has a very low EUV reflectivity and has excellent properties as the absorber layer of an EUV mask blank. However, its reflectivity is not necessarily sufficiently low to the wavelength of inspection light. As a result, the difference between the reflectivity of the surface of the absorber layer and the reflectivity of the surface of the reflective layer or the surface of the protective layer to the wavelength of inspection light tends to be small, and no sufficient contrast at the time of inspection may not be obtained. If no sufficient contrast at the time of inspection is obtained, pattern defects will not sufficiently be distinguished by mask inspection, and an accurate inspection may not be possible.

When a low reflective layer to inspection light is formed on the absorber layer, the reflectivity at a wavelength of inspection light is very low, and a favorable contrast at the time of inspection will be obtained. In a case where a low reflective layer is formed on the absorber layer, the maximum reflectivity of the low reflective layer at the wavelength of inspection light, when the surface of the low reflective layer is irradiated with light within a wavelength region of inspection light, is preferably at most 15%, more preferably at most 10%, further preferably at most 5%.

When the reflectivity of the low reflective layer to light having a wavelength of inspection light is at most 15%, the contrast at the time of inspection will be good. Specifically, the contrast between reflected light with a wavelength of inspection light on the surface of the reflective layer or on the surface of the protective layer, and reflected light at a wavelength of inspection light on the surface of the low reflective layer, is at least 30%.

In this specification, the contrast is obtained by using the following formula.

$$\text{Contrast } (\%) = ((R_2 - R_1)/(R_2 + R_1)) \times 100$$

Here, $R_2$ at the wavelength of the inspection light is the reflectivity of the reflective layer surface or the protective layer surface, and $R_1$ is the reflectivity of the surface of the low reflective layer. Here, the above $R_1$ and $R_2$ are measured in such a state that a pattern is formed in the absorber layer (and the low reflective layer) of the EUV mask blank. The above $R_2$ is a value measured at the reflective layer surface or the protective layer surface exposed as the absorber layer and the low reflective layer were removed by patterning, and $R_1$ is a value measured at the surface of the low reflective layer remained without being removed by patterning.

In a case where the EUV mask blank of the present invention has a low reflective layer, the contrast represented by the above formula is more preferably at least 45%, further preferably at least 60%, particularly preferably at least 80%.

The low reflective layer is constituted by a material having a refractive index to a wavelength of inspection light lower than the absorber layer, and its crystal state is preferably amorphous, in order to achieve the above properties.

A low reflective layer satisfying such properties may be one containing at least one member selected from the group consisting of tantalum (Ta), palladium (Pd), chromium (Cr), silicon (Si) and hafnium (Hf) and at least one member selected from the group consisting of oxygen (O) and nitrogen (N). Preferred examples of such a low reflective layer include a TaPdO layer, a TaPdON layer, a TaON layer, a CrO layer, a CrON layer, a SiON layer, a SiN layer, a HfO layer and a HfON layer.

The total content of Ta, Pd, Cr, Si and Hf in the low reflective layer is preferably from 10 to 55 at %, particularly preferably from 10 to 50 at %, whereby optical properties in a wavelength region of pattern inspection light can be controlled.

Further, the total content of O and N in the low reflective layer is preferably from 45 to 90 at %, particularly preferably from 50 to 90 at %, whereby optical properties in a wavelength region of pattern inspection light can be controlled. The total content of Ta, Pd, Cr, Si, Hf, O and N in the low reflective layer is preferably from 95 to 100 at %, more preferably from 97 to 100 at %, further preferably from 99 to 100 at %.

Of the low reflective layer having the above composition, the crystal state is amorphous and the surface is excellent in smoothness. Specifically, the surface roughness (rms) of the low reflective layer surface is at most 0.5 nm.

As mentioned above, the absorber layer surface is required to be smooth in order to prevent the dimensional precision of a pattern from being deteriorated by the influence of edge roughness. Since the low reflective layer is formed on the absorber layer, from the same reason, its surface is required to be smooth.

When the surface roughness (rms) of the low reflective layer surface is at most 0.5 nm, since the surface of the low reflective layer is sufficiently smooth, the dimensional precision of a pattern will not be deteriorated by the influence of edge roughness. The surface roughness (rms) of the low reflective layer surface is more preferably at most 0.4 nm, further preferably at most 0.3 nm.

Further, with a view to reducing the surface roughness, the low reflective layer preferably contains N.

Further, whether the crystal state of the low reflective layer is amorphous, i.e. an amorphous structure or a microcrystal structure can be confirmed by an X-ray diffraction (XRD) method in the same manner as evaluation of the crystal state of the absorber layer. When the crystal state of the low reflective layer is an amorphous structure or a microcrystal structure, no sharp peak will be observed among the diffraction peaks obtained by the XRD measurement.

In a case where the low reflective layer is formed on the absorber layer, the film thickness of the low reflective layer may properly be set within a range to satisfy the above conditions i.e. (1) to (5).

The low reflective layer having the above structure may be formed by carrying out a sputtering method using a target containing at least one of Ta, Pd, Cr, Si and Hf. Here, as the target, either of the above at least two metal targets and compound target may be used.

Further, use of at least two metal targets is advantageous to adjust the constituting components of the low reflective layer. In a case where at least two metal targets are used, the constituting components of the low reflective layer can be adjusted by adjusting the input power to the target. On the other hand, in a case where a compound target is used, the target composition is preferably preliminarily adjusted so that the low reflective layer to be formed has a desired composition.

The sputtering method using the above target may be carried out in an inert gas atmosphere in the same manner as the sputtering method for forming the absorber layer.

However, in a case where the low reflective layer contains O, the sputtering method is carried out in an inert gas atmosphere containing $O_2$ and at least one of He, Ar, Ne, Kr and Xe. In a case where the low reflective layer contains N, the sputtering method is carried out in an inert gas atmosphere containing $N_2$ and at least one of He, Ar, Ne, Kr and Xe. In a case where the low reflective layer contains O and N, the sputtering method is carried out in an inert gas atmosphere containing $O_2$ and $N_2$, and at least one of He, Ar, Ne, Kr and Xe.

Specific conditions for the sputtering method vary depending upon the target to be used and the composition of the inert gas atmosphere in which the sputtering method is carried out, and in any cases, the sputtering method is carried out under the following conditions.

Conditions for forming the low reflective layer will be described below with reference to a case where the inert gas atmosphere is a mixed gas atmosphere of Ar and $O_2$.

Conditions for Forming Low Reflective Layer

Gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa.

Sputtering gas: A mixed gas of Ar and $O_2$ ($O_2$ gas concentration: 3 to 80 vol %, preferably 5 to 60 vol %, more preferably 10 to 40 vol %).

Input power: 30 to 1,000 W, preferably 50 to 750 W, more preferably 80 to 500 W

Film forming rate: 0.01 to 60 nm/min, preferably 0.05 to 45 nm/min, more preferably 0.1 to 30 nm/min Further, in a case an inert gas other than Ar or a plurality of inert gases are used, the total concentration of the inert gases is within the same concentration range as the Ar gas concentration. Further, in a case where the inert gas atmosphere contains $N_2$, or $N_2$ and $O_2$, the $N_2$ concentration or the total concentration is within the same concentration range as the above oxygen concentration.

The reason as to why it is preferred to form a low reflective layer on the absorber layer in the EUV mask blank of the present invention is that the wavelength of inspection light for a pattern is different from the wavelength of EUV light. Therefore, in a case where EUV light (in the vicinity of 13.5 nm) is used as the inspection light for a pattern, it is considered unnecessary to form a low reflective layer on the absorber layer. The wavelength of inspection light tends to be shifted toward the low wavelength side as the size of a pattern becomes small, and in future, it is considered to be shifted to 193 nm or further to 13.5 nm. In a case where the wavelength of inspection light is 13.5 nm, it is considered unnecessary to form a low reflective layer on the absorber layer.

However, in a case where a low reflective layer is not formed on the absorber layer, in order to increase the washing resistance in a washing step carried out in the process for preparing an EUV mask, the after-mentioned surface protective layer may be formed on the absorber layer. In the washing step carried out in the process for preparing an EUV mask, the surface of an EUV mask blank is washed with an acidic solution containing e.g. sulfuric acid. In a case where a low reflective layer is not formed on the absorber layer, the surface of an EUV mask blank is the surface of the absorber layer. In the case of the EUV mask blank of the present invention, the surface of the upper layer 14a of the absorber layer 14 is the uppermost layer. Depending upon the material of the upper layer 14a or the washing conditions using an acidic solution (for example, washing conditions including washing with a high concentration acidic solution or excessively repeated washing), the film constituting the upper layer 14a is outstandingly corroded in some cases. Among the above-exemplified films constituting the upper layer 14a, the CrN film and the TaPdN film may outstandingly be corroded by an acidic solution depending upon the washing conditions. If the film thickness of the upper layer 14a is remarkably reduced, the reflectivity to EUV light and the phase difference with the reflective layer may change relative to the designed values.

In a case where the upper layer 14a of the absorber layer 14 is the CrN film or the TaPdN film, and no low reflective layer is formed on the absorber layer 14 in the EUV mask blank of the present invention, a surface protective layer to protect the CrN film or the TaPdN film in the washing step may be formed on the CrN film or the TaPdN film.

Figure 4:
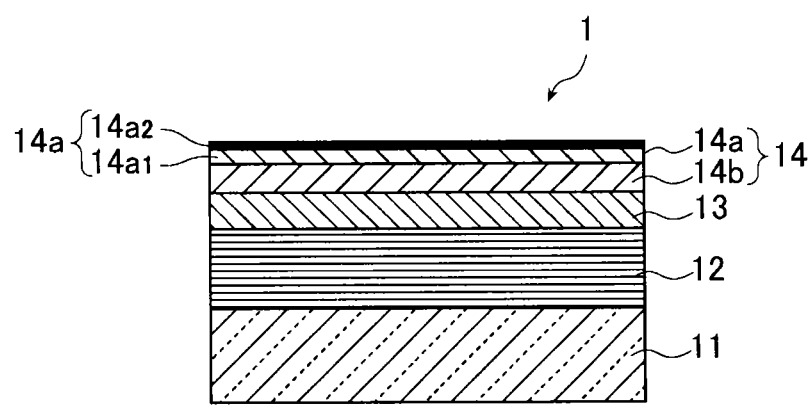
FIG. 4 is a schematic cross-sectional view illustrating another embodiment of the EUV mask blank of the present invention.
Figure 5:
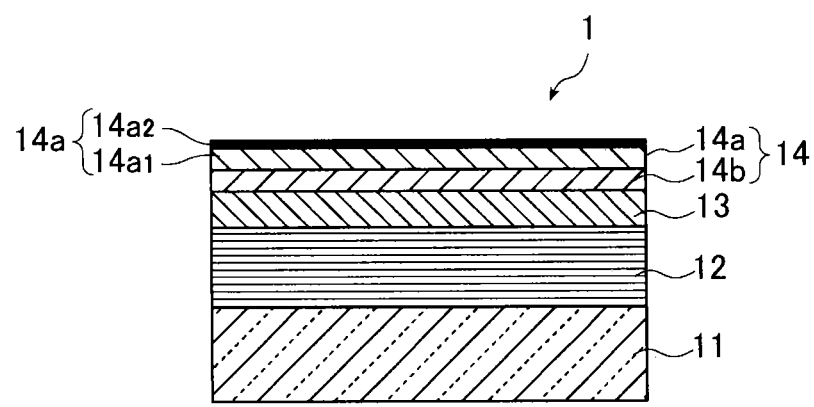
FIG. 5 is a schematic cross-sectional view illustrating still another embodiment of the EUV mask blank of the present invention.

FIGS. 4 and 5 are schematic cross-sectional views illustrating an EUV mask blank having a surface protective layer formed thereon. In an EUV mask blank 1 shown in FIG. 4, the upper layer 14a of the absorber layer 14 has a two-layer structure consisting of a TaPdN film 14a1 and a surface protective layer 14a2 formed on the TaPdN film 14a1. In the mask blank 1 shown in FIG. 4, the lower layer 14b of the absorber layer 14 is a Cr film.

FIG. 5 is a cross-sectional view illustrating another embodiment of an EUV mask blank having a surface protective layer formed thereon. In an EUV mask blank 1 shown in FIG. 5, the upper layer 14a of the absorber layer 14 has a two-layer structure consisting of a CrN film 14a1 and a surface protective layer 14a2 formed on the CrN film 14a1. In the mask blank 1 shown in FIG. 5, the lower layer 14b of the absorber layer 14 is a TaPd film.

In the EUV mask blank 1 shown in FIG. 4, the surface protective layer 14a2 formed on the TaPdN film 14a1 is a TaPdO film containing Ta, Pd and O and having an O content of from 30 to 85 at % or a TaPdON film containing Ta, Pd, O and N and having a total content of O and N of from 40 to 90 at % and a compositional ratio of O to N of O:N=9:1 to 6:4.

In a case where the surface protective layer 14a2 is a TaPdO film, if the O content is less than 30 at %, the TaPdO film is likely to be corroded by an acidic solution used for washing, and it may not sufficiently fulfill a function as the surface protective layer. On the other hand, if the O content of the TaPdO film exceeds 85 at %, discharge tends to be unstable at the time of film forming. The TaPdO film as the surface protective layer 14a2 has an O content of preferably from 35 to 85 at %, more preferably from 40 to 85 at %.

The TaPdO film as the surface protective layer 14a2 has a total content of Ta and Pd of from 15 to 70 at %, preferably from 15 to 65 at %, more preferably from 15 to 60 at %.

The TaPdO film as the surface protective layer 14a2 has a Ta content of from 7 to 32 at % and a Pd content of from 8 to 38 at %, preferably a Ta content of from 7 to 30 at % and a Pd content of from 8 to 35 at %, more preferably a Ta content of from 7 to 27 at % and a Pd content of from 8 to 33 at %.

In a case where the surface protective layer 14a2 is a TaPdON film, if the total content of O and N is less than 40 at %, the TaPdON film is likely to be corroded by an acidic solution used for washing, and therefore it may not sufficiently fulfill a function as the surface protective layer. On the other hand, if the total content of O and N in the TaPdON film exceeds 90 at %, discharge tends to be unstable at the time of film forming. If the O content of the TaPdON film is lower than the above compositional ratio, the TaPdON film is likely to be corroded by an acidic solution used for washing, and therefore it may not sufficiently fulfill a function as the surface protective layer. On the other hand, if the O content of the TaPdON film is higher than the above compositional ratio, discharge tends to be unstable at the time of film forming.

The TaPdON film as the surface protective layer 14a2 has a total content of O and N of preferably from 40 to 85 at %, more preferably from 40 to 80 at %. The compositional ratio of O to N is preferably O:N=9:1 to 6.5:3.5, more preferably O:N=9:1 to 7:3.

The TaPdON film as the surface protective layer 14a2 has a total content of Ta and Pd of from 10 to 60 at %, preferably from 15 to 60 at %, more preferably from 20 to 60 at %.

The TaPdON film as the surface protective layer 14a2 has a Ta content of from 5 to 27 at % and a Pd content of from 5 to 33 at %, preferably a Ta content of from 7 to 27 at % and a Pd content of from 8 to 33 at %, more preferably a Ta content of from 9 to 27 at % and a Pd content of from 11 to 33 at %.

In the EUV mask blank 1 shown in FIG. 5, the surface protective layer 14a2 formed on the CrN film 14a1 is a CrO film containing Cr and O and having a Cr content of from 15 to 70 at % and an O content of from 30 to 85 at %, or a CrON film containing Cr, O and N and having a Cr content of from 10 to 60 at %, a total content of O and N of from 40 to 90 at % and a compositional ratio of O to N of O:N=9:1 to 6:4.

In a case where the surface protective layer 14a2 is a CrO film, if the O content is less than 30 at %, the CrO film is likely to be corroded by an acidic solution used for washing, and therefore it may not sufficiently fulfill a function as the surface protective layer. On the other hand, if the O content of the CrO film exceeds 85 at %, discharge tends to be unstable at the time of film forming.

The CrO film as the surface protective layer 14a2 has a Cr content of preferably from 15 to 65 at %, more preferably from 15 to 60 at %. The O content is preferably from 35 to 85 at %, more preferably from 40 to 85 at %.

In a case where the surface protective layer 14a2 is a CrON film, if the total content of O and N is less than 40 at %, the CrON film is likely to be corroded by an acidic solution used for washing, and therefore it may not sufficiently fulfill a function as the surface protective layer. On the other hand, if the total content of O and N of the CrON film exceeds 90 at %, discharge tends to be unstable at the time of film forming. If the O content of the CrON film is lower than the above compositional ratio, the CrON film is likely to be corroded by an acidic solution used for washing, and therefore it may not sufficiently fulfill a function as the surface protective layer. On the other hand, if the O content of the CrON film is higher than the above compositional ratio, discharge tends to be unstable at the time of film forming.

The CrON film as the surface protective layer 14a2 has a Cr content of preferably from 15 to 60 at %, more preferably from 20 to 60 at %. The total content of O and N is preferably from 40 to 85 at %, more preferably from 40 to 80 at %. The compositional ratio of O to N is preferably O:N=9:1 to 6.5:3.5, more preferably O:N=9:1 to 7:3.

In either EUV mask blank 1 shown in FIG. 4 or 5, the crystal state of the surface protective layer 14a2 is preferably amorphous. That is, the crystal state of each of the CrO film, the CrON film, the TaPdO film and the TaPdON film as the surface protective layer 14a2 is preferably amorphous. When the crystal state of such a film is amorphous, the surface of the absorber layer 14 is excellent in the smoothness, and the above surface roughness (rms) of the surface of the absorber layer 14 can be achieved.

In either EUV mask blank 1 shown in FIG. 4 or 5, the surface protective layer 14a2 may further contain H, Si and B. That is, each of the CrO film, the CrON film, the TaPdO film and the TaPdON film as the surface protective layer 14a2 may further contain H, Si and B. When such a film contains H, Si and B, their total content is preferably from 0.1 to 10 at %, particularly preferably from 0.1 to 5 at %, whereby the crystal structure of such a film is amorphous, thus contributing to making the surface of the absorber layer smooth.

In either EUV mask blank 1 shown in FIG. 4 or 5, the above total film stress of the Cr film and the TaPd film constituting the upper layer 14a and lower layer 14b, including the CrO film, the CrON film, the TaPdO film or the TaPdON film as the surface protective layer 14a2, is achieved.

In either EUV mask blank shown in FIG. 4 or 5, the film thickness of the surface protective layer 14a2 is preferably at least 0.5 nm and at most 5 nm. When the film thickness of the surface protective layer 14a2 is at least 0.5 nm, such a surface protective layer can sufficiently fulfill a function as the surface protective layer. On the other hand, if the film thickness of the surface protective layer 14a2 is larger than 5 nm, an increase of the film thickness will no more contribute to an improvement of the function as the surface protective layer, but rather increases the time required for formation of the surface protective layer 14a2 and thus an increase of the cost required for formation of the surface protective layer 14a2. Further, since the surface protective layer 14a2 is a film containing oxygen, arcing (abnormal discharge) is likely to occur during film forming, and particles are likely to form.

Further, the film thickness of the surface protective layer 14a2 is more preferably from 1 to 5 nm, further preferably from 1.5 to 5 nm.

In either EUV mask blank 1 shown in FIG. 4 or 5, the above-described conditions (1) to (5) regarding the absorber layer 14 of the EUV mask blank of the present invention are satisfied. Accordingly, the total film thickness (L) of the absorber layer 14 is at least 30 nm and at most 45 nm including the film thickness of the surface protective layer 14a2. Further, in the case of the EUV mask blank 1 shown in FIG. 4, the total film thickness of the TaPdN film 14a1 and the TaPdO film or the TaPdON film as the surface protective layer 14a2 is at least 8 nm and at most 36 nm. Further, in the case of the EUV mask blank 1 shown in FIG. 5, the film thickness of the CrN film 14a1 is at least 11 nm and at most 36 nm.

Of either EUV mask blank 1 shown in FIG. 4 or 5, the CrO film, the CrON film, the TaPdO film or the TaPdON film as the surface protective layer 14a2 may be formed by a known film-forming method such as a sputtering method.

In a case where the surface protective layer 14a2 is a CrO film, a sputtering method such as a magnetron sputtering method or an ion beam sputtering method is carried out using a Cr target in an inert gas atmosphere containing $O_2$ and at least one of He, Ar, Ne, Kr and Xe. Conditions for forming a CrO film will be described below with reference to a case where the inert gas atmosphere is an atmosphere containing Ar and $O_2$.

Conditions for Forming CrO Film
Gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa.
Sputtering gas: A mixed gas of Ar and $O_2$ ($O_2$ gas concentration: 3 to 80 vol %, preferably 5 to 60 vol %, more preferably 10 to 40 vol %).
Input power: 30 to 1,000 W, preferably 50 to 750 W, more preferably 80 to 500 W
Film forming rate: 0.00017 to 1 nm/sec, preferably 0.00083 to 0.75 nm/sec, more preferably 0.0017 to 0.5 nm/sec The above is described with respect to a case where the sputtering gas is a mixed gas of Ar and $O_2$, and in a case where a mixed gas of $O_2$ and an inert gas other than Ar or a mixed gas of $O_2$ and a plurality of inert gases is used as the sputtering gas, the total concentration of the inert gases is within the same concentration range as the Ar gas concentration. The same applies to the following conditions for forming other films.

In a case where the surface protective layer 14a2 is a CrON film, a sputtering method such as a magnetron sputtering method or an ion beam sputtering method is carried out using a Cr target in an inert gas atmosphere containing $O_2$ and $N_2$ and at least one of He, Ar, Ne, Kr and Xe. Conditions for forming a CrON film will be described with reference to a case where the inert gas atmosphere is an atmosphere containing Ar and $O_2$ and $N_2$.

Conditions for Forming CrON Film
Gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa.
Sputtering gas: A mixed gas of Ar, $O_2$ and $N_2$ ($O_2$ gas concentration: 5 to 80 vol %, $N_2$ gas concentration: 5 to 75 vol %, preferably $O_2$ gas concentration: 6 to 70 vol %, $N_2$ gas concentration: 6 to 35 vol %, more preferably $O_2$ gas concentration: 10 to 30 vol %, $N_2$ gas concentration: 10 to 30 vol %; Ar gas concentration: 5 to 90 vol %, preferably 10 to 88 vol %, more preferably 20 to 80 vol %).
Input power: 30 to 1,000 W, preferably 50 to 750 W, more preferably 80 to 500 W
Film forming rate: 0.00017 to 1 nm/sec, preferably 0.00083 to 0.75 nm/sec, more preferably 0.0017 to 0.5 nm/sec In a case where the surface protective layer 14a2 is a TaPdO film, a sputtering method such as a magnetron sputtering method or an ion beam sputtering method is carried out using a target containing Ta and Pd in an inert gas atmosphere containing $O_2$ and at least one of He, Ar, Ne, Kr and Xe.

In this specification, use of a target containing Ta and Pd includes both of use of two metal targets i.e. a Ta target and a Pd target and use of a compound target containing Ta and Pd.

Use of two metal targets is advantageous to adjust the constituting components of TaPdO. In a case where two metal targets are used, the constituting components of the TaPdO film can be adjusted by adjusting the input power to the targets. Whereas, in a case where a compound target is used, the target composition is preferably preliminarily adjusted so that the TaPdO film to be formed as a desired composition.

Conditions for forming a TaPdO film will be described with reference to a case where the inert gas atmosphere contains Ar and $O_2$.
Conditions for Forming TaPdO Film
Gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa.
Sputtering gas: A mixed gas of Ar and $O_2$ ($O_2$ gas concentration: 3 to 80 vol %, preferably 5 to 60 vol %, more preferably 10 to 40 vol %).
Input power: 30 to 1,000 W, preferably 50 to 750 W, more preferably 80 to 500 W
Film forming rate: 0.00017 to 1 nm/sec, preferably 0.00083 to 0.75 nm/sec, more preferably 0.0017 to 0.5 nm/sec In a case where the surface protective layer 14a2 is a TaPdON film, a sputtering method such as a magnetron sputtering method or an ion beam sputtering method is carried out using a target containing Ta and Pd in an inert gas atmosphere containing $O_2$ and $N_2$ and at least one of He, Ar, Ne, Kr and Xe. Conditions for forming a TaPdON film will be described with reference to a case where the inert gas atmosphere is an atmosphere containing Ar and $O_2$ and $N_2$.

Conditions for Forming TaPdON Film

Gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa.

Sputtering gas: A mixed gas of Ar, $O_2$ and $N_2$ ($O_2$ gas concentration: 5 to 80 vol %, $N_2$ gas concentration: 5 to 75 vol %, preferably $O_2$ gas concentration: 6 to 70 vol %, $N_2$ gas concentration: 6 to 35 vol %, more preferably $O_2$ gas concentration: 10 to 30 vol %, $N_2$ gas concentration: 10 to 30 vol %; Ar gas concentration: 5 to 90 vol %, preferably 10 to 88 vol %, more preferably 20 to 80 vol %).

Input power: 30 to 1,000 W, preferably 50 to 750 W, more preferably 80 to 500 W

Film forming rate: 0.00017 to 1 nm/sec, preferably 0.00083 to 0.75 nm/sec, more preferably 0.0017 to 0.5 nm/sec In the EUV mask blank of the present invention, on the absorber layer (in a case where a low reflective layer is formed on the absorber layer, on the low reflective layer), a hard mask layer as disclosed in JP-A-2009-54899 or JP-A-2009-21582, that is, a layer made of a material having a resistance to etching conditions for the absorber layer (in a case where a low reflective layer is formed on the absorber layer, the absorber layer and the low reflective layer) may be formed. It is possible to make the resist thin by forming such a hard mask layer and increasing the etching selectivity of the absorber layer (in a case where a low reflective layer is formed on the absorber layer, the absorber layer and the low reflective layer) to the hard mask layer under etching conditions for the absorber layer (in a case where a low reflective layer is formed on the absorber layer, the absorber layer and the low reflective layer), specifically, the ratio of the etching rate of the absorber layer (in a case where a low reflective layer is formed on the absorber layer, the etching rate of the absorber layer and the low reflective layer) to the etching rate of the hard mask layer under etching conditions for the absorber layer (in a case where a low reflective layer is formed on the absorber layer, the absorber layer and the low reflective layer).

Further, the EUV mask blank of the present invention may have a known functional film in the field of an EUV mask blank, in addition to the above constitution. A specific example of such a functional film may be a high electrically conductive coating formed on the rear side of a substrate to promote the electrostatic chucking of the substrate, as disclosed in e.g. JP-A-2003-501823. Here, in the substrate 11 shown in FIG. 1, the rear side of the substrate means the surface on the opposite side to the side where the reflective layer 12 is formed. For the high electrically conductive coating to be formed on the rear side of the substrate for such a purpose, the electrical conductivity and the thickness of the constituting material are selected so that the sheet resistance will be at most 100Ω/□. The constituting material of the high electrically conductive coating may be selected widely from those disclosed in known literatures. For example, a high dielectric constant coating disclosed in JP-A-2003-501823, specifically a coating comprising silicon, TiN, molybdenum, chromium and TaSi may be applied. The thickness of the high dielectric constant coating may, for example, be from 10 to 1,000 nm.

The high dielectric constant coating may be formed by means of a known film-forming method e.g. a sputtering method such as a magnetron sputtering method or an ion beam sputtering method, a CVD method, a vacuum vapor deposition method or an electroplating method.

EXAMPLES

Now, the present invention will be described in further detail with reference to Examples.

Example 1

In this Example, an EUV mask blank 1 shown in FIG. 1 was prepared.

As a substrate 11 for film formation, a $SiO_2$—$TiO_2$ type glass substrate (size: 6 inches (152 mm) square, thickness: 6.3 mm) was used. The thermal expansion coefficient of this glass substrate at 20° C. was $0.05 \times 10^{-7}$/° C., the Young's modulus was 67 GPa, the Poisson ratio was 0.17, and the specific rigidity was $3.07 \times 10^7$ $m^2/s^2$. This glass substrate was polished to form a smooth surface having a surface roughness (rms) of at most 0.15 nm and a flatness of at most 100 nm.

On the rear surface side of the substrate 11, a Cr film having a thickness of 100 nm was formed by means of a magnetron sputtering method to provide a high electrically conductive coating having a sheet resistance of 100Ω/□.

By using the formed Cr film, the substrate 11 (size: 6 inches (152 mm) square, thickness: 6.3 mm) was fixed to a usual electrostatic chuck of a flat plate shape, and on the surface of the substrate 11, a Si film and then a Mo film were alternately formed by means of an ion beam sputtering method for 40 cycles to form a Mo/Si multilayer reflective film (reflective layer 12) having a total film thickness of 272 nm ((4.5 nm+2.3 nm)×40).

Further, on the Mo/Si multilayer reflective film (reflective layer 12), a Ru film (film thickness: 2.5 nm) was formed by means of an ion beam sputtering method to form a protective layer 13.

The film forming conditions for the Si film, the Mo film and the Ru film are as follows.

Film Forming Conditions for Si Film
Target: Si target (boron-doped)
Sputtering gas: Ar gas (gas pressure: 0.02 Pa)
Voltage: 700 V
Film forming rate: 0.077 nm/sec
Film thickness: 4.5 nm
Film Forming Conditions for Mo Film
Target: Mo target
Sputtering gas: Ar gas (gas pressure: 0.02 Pa)
Voltage: 700 V
Film forming rate: 0.064 nm/sec
Film thickness: 2.3 nm
Film Forming Conditions for Ru Film
Target: Ru target
Sputtering gas: Ar gas (gas pressure: 0.02 Pa)
Voltage: 500 V
Film forming rate: 0.023 nm/sec
Film thickness: 2.5 nm Then, on the protective layer 13, a CrN film as the lower layer 14b of the absorber layer 14 was formed by means of a magnetron sputtering method.

Film forming conditions for the lower layer 14b (CrN film) are as follows.

Film Forming Conditions for Lower Layer 14b (CrN Film)
Target: Cr target
Sputtering gas: A mixed gas of Ar and $N_2$ (Ar: 58.2 vol %, $N_2$: 41.8 vol %, gas pressure: 0.1 Pa)
Input power: 1,500 W
Film forming rate: 0.18 nm/sec
Film thickness: 16 nm The composition of the film formed is measured by using an X-ray photoelectron spectrometer (manufactured by PER- KIN ELMER-PHI), a secondary ion mass spectrometer (manufactured by PHI-ATOMIKA) and a Rutherford back scattering spectroscopy (manufactured by Kobe Steel, Ltd.). The compositional ratio (at %) of the lower layer 14b (CrN film) was Cr:N=86.0:14.0.

Then, on the lower layer 14b (CrN film), a TaPdN film as the upper layer 14a of the absorber layer 14 was formed by means of a magnetron sputtering method. The film forming conditions for the upper layer 14a (TaPdN film) are as follows.
Film Forming Conditions for Upper Layer 14a (TaPdN Film)
Target: Ta target and Pd target
Sputtering gas: A mixed gas of Ar and $N_2$ (Ar: 86 vol %, $N_2$: 14 vol %, gas pressure: 0.3 Pa)
Input power: Ta target=150 W, Pd target=75 W
Film forming rate: 0.32 nm/sec
Film thickness: 16 nm The composition of the film formed is measured in the same manner as for the lower layer 14b. The composition of the upper layer 14a (TaPdN film) is Ta:Pd:N=41:25:34.

The total film thickness (L) of the absorber layer 14 is 32 nm. With respect to this EUV mask blank, the reflection properties of EUV light were evaluated by the following procedure.

The EUV reflectivity of the surface of the absorber layer 14 and the phase difference (φ) between the surface of the protective layer 13 and the surface of the absorber layer 14, of the above film constitution, were obtained by calculation. Further, the gradient (Δφ/ΔL) of the change (Δφ) of the phase difference to the film thickness change (ΔL) was obtained from the change (Δφ) of the phase difference in a film thickness range within which the phase difference p is 180°±10°, obtained by calculation. The results are as follows.
Peak reflectivity of the surface of the absorber layer 14 to EUV light: 5.6%
The phase difference (φ) between EUV reflected light at the surface of the protective layer 13 and EUV reflected light at the surface of the absorber layer 14: 171.3°
Gradient (Δφ/ΔL) of the change (Δφ) of the phase difference (φ) to the change (ΔL) of the total film thickness (L) of the absorber layer 14: 0.0 deg/nm Example 2

The same operation as in Example 1 was carried out except that the film thickness of the CrN film as the lower layer 14b was 30 nm, the film thickness of the TaPdN film as the upper layer 14a was 8 nm, and the total film thickness (L) of the absorber layer 14 was 38 nm. The reflection properties for EUV light are as follows.
The peak reflectivity of the surface of the absorber layer 14 to EUV light: 5.6%
The phase difference (φ) between EUV reflected light on the surface of the protective layer 13 and EUV reflected light on the surface of the absorber layer 14: 174.0°
Gradient (Δφ/ΔL) of the change (Δφ) of the phase difference (φ) to the change (ΔL) of the total film thickness (L) of the absorber layer 14: 9.1 deg/nm Example 3

The same operation as in Example 1 was carried out except that the film thickness of the CrN film as the lower layer 14b was 5 nm, the film thickness of the TaPdN film as the upper layer 14a was 25 nm, and the total film thickness (L) of the absorber layer 14 was 30 nm. The reflection properties for EUV light are as follows.
The peak reflectivity of the surface of the absorber layer 14 to EUV light: 8.5%
The phase difference (φ) between EUV reflected light on the surface of the protective layer 13 and EUV reflected light on the surface of the absorber layer 14: 179.2°
Gradient (Δφ/ΔL) of the change (Δφ) of the phase difference (φ) to the change (ΔL) of the total film thickness (L) of the absorber layer 14: 12.9 deg/nm Example 4

The same operation as in Example 1 was carried out except that the film thickness of the CrN film as the lower layer 14b was 35 nm, the film thickness of the TaPdN film as the upper layer 14a was 9 nm, and the total film thickness (L) of the absorber layer 14 was 44 nm. The reflection properties for EUV light are as follows.
The peak reflectivity of the surface of the absorber layer 14 to EUV light: 5.1%
The phase difference (φ) between EUV reflected light on the surface of the protective layer 13 and EUV reflected light on the surface of the absorber layer 14: 186.9°
Gradient (Δφ/ΔL) of the change (Δφ) of the phase difference (φ) to the change (ΔL) of the total film thickness (L) of the absorber layer 14: 12.5 deg/nm Example 5

In this Example, a TePdN film was formed as the lower layer 14b and a CrN film was formed as the upper layer 14a. The film forming conditions for the TaPdN film and the CrN film were the same as in Example 1. The film thickness of the TaPdN film as the lower layer 14b was 10 nm, the film thickness of the CrN film as the upper layer 14a was 28 nm, and the total film thickness (L) of the absorber layer 14 was 38 nm. The reflection properties for EUV light are as follows.
The peak reflectivity of the surface of the absorber layer 14 to EUV light: 5.4%
The phase difference (φ) between EUV reflected light on the surface of the protective layer 13 and EUV reflected light on the surface of the absorber layer 14: 179.5°
Gradient (Δφ/ΔL) of the change (Δφ) of the phase difference (φ) to the change (ΔL) of the total film thickness (L) of the absorber layer 14: 9.7 deg/nm Example 6

The same operation as in Example 5 was carried out except that the film thickness of the TaPdN film as the lower layer 14b was 25 nm, the film thickness of the CrN film as the upper layer 14a was 6 nm, and the total film thickness (L) of the absorber layer 14 was 31 nm. The reflection properties for EUV light are as follows.
The peak reflectivity of the surface of the absorber layer 14 to EUV light: 7.5%
The phase difference (φ) between EUV reflected light on the surface of the protective layer 13 and EUV reflected light on the surface of the absorber layer 14: 181.2°
Gradient (Δφ/ΔL) of the change (Δφ) of the phase difference (φ) to the change (ΔL) of the total film thickness (L) of the absorber layer 14: 10.2 deg/nm Example 7

The same operation as in Example 1 was carried out except that the film thickness of the CrN film as the lower layer 14b was 2 nm, the film thickness of the TaPdN film as the upper layer 14a was 36 nm, and the total film thickness (L) of the absorber layer 14 was 38 nm. The reflection properties for EUV light are as follows.
The peak reflectivity of the surface of the absorber layer 14 to EUV light: 5.4%
The phase difference (φ) between EUV reflected light on the surface of the protective layer 13 and EUV reflected light on the surface of the absorber layer 14: 181.2°
Gradient (Δφ/ΔL) of the change (Δφ) of the phase difference (φ) to the change (ΔL) of the total film thickness (L) of the absorber layer 14: 12.1 deg/nm Example 8

The same operation as in Example 7 was carried out except that as shown in the EUV mask blank 1 shown in FIG. 4, the film thickness of the CrN film as the lower layer 14b was 2 nm, the upper layer 14a had a two-layer structure consisting of a TaPdN film 14a1 and a surface protective layer 14a2 formed on the TaPdN film 14a1, the film thickness of the TaPdN film 14a1 was 33 nm, and a TaPdO film was formed for 3 nm by the following procedure, as the surface protective layer 14a2. The total film thickness (L) of the absorber layer 14 was 38 nm.
Film Forming Conditions for Surface Protective Layer 14a2 (TaPdO Film)
Target: Ta target and Pd target
Sputtering gas: A mixed gas of Ar and $O_2$ (Ar: 86 vol %, $O_2$: 14 vol %, gas pressure: 0.3 Pa)
Input power: Ta target=150 W, Pd target=150 W
Film forming rate: 0.18 nm/sec
Film thickness: 3 nm
The composition of the film formed is measured in the same manner as for the upper layer 14a in Example 1. The composition of the surface protective layer 14a2 (TaPdO film) is Ta:Pd:O=27:32:41.
The reflection properties for EUV light are as follows.
The peak reflectivity of the surface of the absorber layer 14 to EUV light: 5.3%
The phase difference (φ) between EUV reflected light on the surface of the protective layer 13 and EUV reflected light on the surface of the absorber layer 14: 180.3°
Gradient (Δφ/ΔL) of the change (Δφ) of the phase difference (q) to the change (ΔL) of the total film thickness (L) of the absorber layer 14: 11.5 deg/nm
In this Example, the washing resistance was evaluated by the following procedure.
(Evaluation of Washing Resistance)
A sample for evaluation of washing resistance was prepared by forming a TaPdO film on a quartz glass substrate in the same manner as in the formation of the surface protective layer 14a2. For comparison, a sample having a TaPdN formed on a quartz glass substrate was prepared in the same manner as the formation of the upper layer 14a (TaPdN film) in Example 1. Here, the film thickness of the TaPdN film of this sample was 4 nm.
The above samples were repeatedly washed in an acidic solution containing sulfuric acid for 3 minutes five times, and the film thickness change as between before and after the washing was measured by XRR (X-ray reflection, manufactured by Rigaku Corporation).
In the case of the TaPdO film, the change of the film thickness by repeated washing five times was at most 0.1 nm. Whereas, in the case of the TaPdN film, the change of the film thickness by repeated washing five times was 1.1 nm.

Example 9

The same operation as in Example 8 is carried out except that the surface protective layer 14a2 is a TaPdON film. That is, the film thickness of the CrN film as the lower layer 14b is 2 nm, the film thickness of the TaPdN film 14a1 as the upper layer 14a is 33 nm, the film thickness of the TaPdON film as the surface protective layer 14a2 is 3 nm, and the total film thickness (L) of the absorber layer 14 is 38 nm. The TaPdON film as the surface protective layer 14a2 is formed by the following procedure.
Film Forming Conditions for Surface Protective Layer 14a2 (TaPdON Film)
Target: Ta target and Pd target
Sputtering gas: A mixed gas of Ar, $O_2$ and $N_2$ (Ar: 72 vol %, $O_2$: 14 vol %, $N_2$: 14 vol %, gas pressure: 0.3 Pa)
Input power: Ta target=150 W, Pd target=150 W
Film forming rate: 0.20 nm/sec
Film thickness: 3 nm
The composition of the film formed is measured by the same method as for the upper layer 14a in Example 1. The composition of the surface protective layer 14a2 (TaPdON film) is Ta:Pd:O:N=21:26:40:13.
The reflection properties for EUV light are as follows.
The peak reflectivity of the surface of the absorber layer 14 to EUV light: 5.1%
The phase difference (φ) between EUV reflected light on the surface of the protective layer 13 and EUV reflected light on the surface of the absorber layer 14: 175.9°
Gradient (Δφ/ΔL) of the change (Δφ) of the phase difference (φ) to the change (ΔL) of the total film thickness (L) of the absorber layer 14: 10.1 deg/nm
Further, the washing resistance was evaluated in the same manner as in Example 8 and as a result, the film thickness change by repeated washing five times is at most 0.2 nm.

Comparative Example 1

In this Comparative Example, the absorber layer 14 was a single layer of a TaPdN film. The film forming conditions for the TaPdN film are the same as in Example 1.
The film thickness of the TaPdN film as the absorber layer 14 is 30 nm. The reflection properties for EUV light are as follows.
The peak reflectivity of the surface of the absorber layer 14 to EUV light: 8.3%
The phase difference (φ) between EUV reflected light on the surface of the protective layer 13 and EUV reflected light on the surface of the absorber layer 14: 171.7°
Gradient (Δφ/ΔL) of the change (Δφ) of the phase difference (φ) to the change (ΔL) of the total film thickness (L) of the absorber layer 14: 16.0 deg/nm
In this Comparative Example, Δφ/ΔL exceeded 15 deg/nm.

Comparative Example 2

In this Comparative Example, the absorber layer 14 was a single layer of a CrN film. The film forming conditions for the CrN film are the same as in Example 1. The film thickness of the CrN film as the absorber layer 14 is 49 nm. The reflection properties for EUV light are as follows.
The peak reflectivity of the surface of the absorber layer 14 to EUV light: 1.9%
The phase difference (φ) between EUV reflected light on the surface of the protective layer 13 and EUV reflected light on the surface of the absorber layer 14: 174.5°
Gradient (Δφ/ΔL) of the change (Δφ) of the phase difference (φ) to the change (ΔL) of the total film thickness (L) of the absorber layer 14: 0.0 deg/nm In this Comparative Example, the peak reflectivity of the surface of the absorber layer 14 to EUV light was less than 5%.

Comparative Example 3

In this Comparative Example, the absorber layer 14 was a single layer of a CrN film. The film forming conditions for the CrN film are the same as in Example 1. The film thickness of the CrN film as the absorber layer 14 is 44 nm. The reflection properties for EUV light are as follows.
The peak reflectivity of the surface of the absorber layer 14 to EUV light: 4.7%
The phase difference ($\phi$) between EUV reflected light on the surface of the protective layer 13 and EUV reflected light on the surface of the absorber layer 14: 171.2°
Gradient ($\Delta\phi/\Delta L$) of the change ($\Delta\phi$) of the phase difference ($\phi$) to the change ($\Delta L$) of the total film thickness (L) of the absorber layer 14: 13.3 deg/nm
In this Comparative Example, the peak reflectivity of the surface of the absorber layer 14 to EUV light was less than 5%.

Comparative Example 4

In this Comparative Example, the same operation as in Example 1 was carried out except that the film thickness of the CrN film as the lower layer 14b was 20 nm, the film thickness of the TaPdN film as the upper layer 14a was 9 nm, and the total film thickness (L) of the absorber layer 14 was 29 nm. The reflection properties for EUV light are as follows.
The peak reflectivity of the surface of the absorber layer 14 to EUV light: 10.8%
The phase difference ($\phi$) between EUV reflected light on the surface of the protective layer 13 and EUV reflected light on the surface of the absorber layer 14: 126.3°
Gradient ($\Delta\phi/\Delta L$) of the change ($\Delta\phi$) of the phase difference ($\phi$) to the change ($\Delta L$) of the total film thickness (L) of the absorber layer 14: 13.2 deg/nm
In this Comparative Example in which the total film thickness (L) of the absorber layer 14 was less than 30 nm, $\phi$ was out of the range of 180°±10°.

Comparative Example 5

In this Comparative Example, the same operation as in Example 1 was carried out except that the film thickness of the CrN film as the lower layer 14b was 37 nm, the film thickness of the TaPdN film as the upper layer 14a was 9 nm, and the total film thickness (L) of the absorber layer 14 was 46 nm. The reflection properties for EUV light are as follows.
The peak reflectivity of the surface of the absorber layer 14 to EUV light: 2.8%
The phase difference ($\phi$) between EUV reflected light on the surface of the protective layer 13 and EUV reflected light on the surface of the absorber layer 14: 218.6°
Gradient ($\Delta\phi/\Delta L$) of the change ($\Delta\phi$) of the phase difference ($\phi$) to the change ($\Delta L$) of the total film thickness (L) of the absorber layer 14: 14.6 deg/nm
In this Comparative Example in which the total film thickness (L) of the absorber layer 14 exceeded 45 nm, the peak reflectivity of the surface of the absorber layer 14 to EUV light was less than 5%, and c was out of the range of 180°±10°.

Comparative Example 6

In this Comparative Example, the same operation as in Example 1 was carried out except that the film thickness of the CrN film as the lower layer 14b was 32 nm, the film thickness of the TaPdN film as the upper layer 14a was 7 nm, and the total film thickness (L) of the absorber layer 14 was 39 nm. The reflection properties for EUV light are as follows.
The peak reflectivity of the surface of the absorber layer 14 to EUV light: 4.2%
The phase difference ($\phi$) between EUV reflected light on the surface of the protective layer 13 and EUV reflected light on the surface of the absorber layer 14: 180.0°
Gradient ($\Delta\phi/\Delta L$) of the change ($\Delta\phi$) of the phase difference ($\phi$) to the change ($\Delta L$) of the total film thickness (L) of the absorber layer 14: 0.0 deg/nm
In this Comparative Example in which the film thickness of the TaPdN film is less than 8 nm, the peak reflectivity of the surface of the absorber layer 14 to EUV light was less than 5%.

Comparative Example 7

The same operation as in Example 5 was carried out except that the film thickness of the TaPdN film as the lower layer 14b was 32 nm, the film thickness of the CrN film as the upper layer 14a was 7 nm, and the total film thickness (L) of the absorber layer 14 was 39 nm. The reflection properties for EUV light were as follows.
The peak reflectivity of the surface of the absorber layer 14 to EUV light: 3.9%
The phase difference ($\phi$) between EUV reflected light on the surface of the protective layer 13 and EUV reflected light on the surface of the absorber layer 14: 177.7°
Gradient ($\Delta\phi/\Delta L$) of the change ($\Delta\phi$) of the phase difference ($\phi$) to the change ($\Delta L$) of the total film thickness (L) of the absorber layer 14: 0 deg/nm
In this Comparative Example in which the film thickness of the TaPdN film was less than 8 nm, the peak reflectivity of the surface of the absorber layer 14 to EUV light was less than 5%.

REFERENCE SYMBOLS

1: EUV mask blank
11: Substrate
12: Reflective layer (multilayer reflective film)
13: Protective layer
14: Absorber layer
14a: Upper layer
14a1: CrN film or TaPdN film
14a2: Surface protective layer
14b: Lower layer The entire disclosures of Japanese Patent Application No. 2013-115186 filed on May 31, 2013 and Japanese Patent Application No. 2013-239914 filed on Nov. 20, 2013 including specifications, claims, drawings and summaries are incorporated herein by reference in their entireties.

What is claimed is:
1. A reflective mask blank for EUV lithography, comprising a substrate, and a reflective layer for reflecting EUV light and an absorber layer for absorbing EUV light formed in this order on the substrate,
wherein the absorber layer consists of a layer (upper layer) on the surface side and a layer (lower layer) on the substrate side,
one of the upper layer and the lower layer of the absorber layer is a Cr film containing chromium (Cr) as the main component and containing at least one of oxygen (O) and nitrogen (N), the other is a TaPd film containing tantalum (Ta) and palladium (Pd) as the main components and containing at least one of oxygen (O) and nitrogen (N), and the absorber layer satisfies the following conditions (1) to (5):

(1) the total film thickness (L) of the absorber layer is at least 30 nm and at most 45 nm;

(2) the film thickness of the TaPd film is at least 8 nm and at most 36 nm;

(3) the peak reflectivity of the surface of the absorber layer to EUV light is at least 5% and at most 12%;

(4) the phase difference (φ) between EUV reflected light on the surface of the reflective layer and EUV reflected light on the surface of the absorber layer, is within a range of 180°±10°; and (5) the gradient (Δφ/ΔL) of the change (Δφ) of the above phase difference ((φ) to the change (ΔL) of the total film thickness (L) of the absorber layer is at most 15 deg/nm.

2. The reflective mask blank for EUV lithography according to claim 1, wherein the Cr film is a CrN film containing chromium (Cr) and nitrogen (N), and having a Cr content of from 40 to 97 at %, a N content of from 3 to 60 at % and a total content of Cr and N of from 95 to 100 at %.

3. The reflective mask blank for EUV lithography according to claim 2, wherein the upper layer has a two-layer structure of the CrN film and a surface protective layer formed on the CrN film, and the surface protective layer is a CrO film containing Cr and O and having a Cr content of from 15 to 70 at % and an O content of from 30 to 85 at %, or a CrON film containing Cr, O and N and having a Cr content of from 10 to 60 at %, a total content of O and N of from 40 to 90 at % and a compositional ratio of O to N of O:N=9:1 to 6:4.

4. The reflective mask blank for EUV lithography according to claim 3, wherein the film thickness of the surface protective layer is at least 0.5 nm and at most 5 nm.

5. The reflective mask blank for EUV lithography according to claim 3, wherein the surface protective layer further contains hydrogen (H), silicon (Si) and boron (B) in a total content of from 0.1 to 10 at %.

6. The reflective mask blank for EUV lithography according to claim 3, wherein the surface protective layer is the CrO film, and the CrO film is formed by carrying out a sputtering method using a target containing chromium (Cr) in an inert gas atmosphere containing oxygen ($O_2$) and at least one of helium (He), argon (Ar), neon (Ne), krypton (Kr) and xenon (Xe).

7. The reflective mask blank for EUV lithography according to claim 3, wherein the surface protective layer is the CrON film, and the CrON film is formed by carrying out a sputtering method using a target containing chromium (Cr) in an inert gas atmosphere containing oxygen ($O_2$) and nitrogen ($N_2$) and at least one of helium (He), argon (Ar), neon (Ne), krypton (Kr) and xenon (Xe).

8. The reflective mask blank for EUV lithography according to claim 2, wherein the Cr film is the CrN film, and the CrN film is formed by carrying out a sputtering method using a target containing chromium (Cr) in an inert gas atmosphere containing nitrogen ($N_2$) and at least one of helium (He), argon (Ar), neon (Ne), krypton (Kr) and xenon (Xe).

9. The reflective mask blank for EUV lithography according to claim 1, wherein the TaPd film is a TaPdN film containing tantalum (Ta), palladium (Pd) and nitrogen (N), and having a Ta content of from 10 to 60 at %, a Pd content of from 20 to 70 at %, a N content of from 10 to 70 at % and a total content of Ta, Pd and N of from 95 to 100 at %.

10. The reflective mask blank for EUV lithography according to claim 9, wherein the upper layer has a two-layer structure of the TaPdN film and a surface protective layer formed on the TaPdN film, and the surface protective layer is a TaPdO film containing Ta, Pd and O and having an O content of from 30 to 85 at %, or a TaPdON film containing Ta, Pd, O and N and having a total content of O and N of from 40 to 90 at % and a compositional ratio of O to N of O:N=9:1 to 6:4.

11. The reflective mask blank for EUV lithography according to claim 10, wherein the TaPdO film has a Ta content of from 7 to 32 at %, a Pd content of from 8 to 38 at %, and an O content of from 30 to 85 at %.

12. The reflective mask blank for EUV lithography according to claim 10, wherein the TaPdON film has a Ta content of from 5 to 27 at %, a Pd content of from 5 to 33 at %, a total content of O and N of from 40 to 90 at %, and a compositional ratio of O to N of O:N=9:1 to 6:4.

13. The reflective mask blank for EUV lithography according to claim 10, wherein the surface protective layer is the TaPdO film, and the TaPdO film is formed by carrying out a sputtering method using a target containing tantalum (Ta) and palladium (Pd) in an inert gas atmosphere containing oxygen ($O_2$) and at least one of helium (He), argon (Ar), neon (Ne), krypton (Kr) and xenon (Xe).

14. The reflective mask blank for EUV lithography according to claim 10, wherein the surface protective layer is the TaPdON film, and the TaPdON film is formed by carrying out a sputtering method using a target containing tantalum (Ta) and palladium (Pd) in an inert gas atmosphere containing oxygen ($O_2$) and nitrogen ($N_2$) and at least one of helium (He), argon (Ar), neon (Ne), krypton (Kr) and xenon (Xe).

15. The reflective mask blank for EUV lithography according to claim 9, wherein the TaPd film is the TaPdN film, and the TaPdN film is formed by carrying out a sputtering method using a target containing tantalum (Ta) and palladium (Pd) in an inert gas atmosphere containing nitrogen ($N_2$) and at least one of helium (He), argon (Ar), neon (Ne), krypton (Kr) and xenon (Xe).

16. The reflective mask blank for EUV lithography according to claim 1, wherein at least one of the Cr film and the TaPd film further contains hydrogen (H), silicon (Si) and boron (B) in a total content of from 0.1 to 10 at %.

17. The reflective mask blank for EUV lithography according to claim 1, wherein the crystal state of the absorber layer is amorphous.

18. The reflective mask blank for EUV lithography according to claim 1, wherein the surface roughness (rms) of the surface of the absorber layer is at most 0.5 nm.

19. The reflective mask blank for EUV lithography according to claim 1, wherein a protective layer to protect the reflective layer at the time of forming a pattern on the absorber layer is formed between the reflective layer and the absorber layer, and the protective layer contains Ru or a Ru compound as a constituting material.

20. The reflective mask blank for EUV lithography according to claim 19, wherein the upper layer is the above TaPd film, and the lower layer is the above Cr film.

21. A reflective mask for EUV lithography produced by patterning the absorber layer of the reflective mask blank for EUV lithography as defined in claim 1.

* * * * *